United States Patent [19]
Williams et al.

[11] Patent Number: 5,689,209
[45] Date of Patent: Nov. 18, 1997

[54] LOW-SIDE BIDIRECTIONAL BATTERY DISCONNECT SWITCH

[75] Inventors: Richard K. Williams; Robert G. Blattner, both of Cupertino, Calif.

[73] Assignee: Siliconix Incorporated, Santa Clara, Calif.

[21] Appl. No.: 367,515

[22] Filed: Dec. 30, 1994

[51] Int. Cl.[6] .................................................. H03K 17/56
[52] U.S. Cl. .......................... 327/425; 327/434; 327/534
[58] Field of Search ............................ 327/29, 382, 434, 327/437, 534, 580, 584, 425; 365/229; 307/46, 48, 85

[56] References Cited

U.S. PATENT DOCUMENTS

| | | |
|---|---|---|
| 4,617,473 | 10/1986 | Bingham .......................... 365/229 |
| 4,728,825 | 3/1988 | Sugayama et al. ................ 327/434 |
| 4,847,522 | 7/1989 | Fuller et al. . |
| 5,280,455 | 1/1994 | Kanaishi .......................... 365/229 |
| 5,420,451 | 5/1995 | Williams et al. ................. 257/402 |
| 5,430,403 | 7/1995 | Moyer et al. ..................... 327/365 |
| 5,434,526 | 7/1995 | Tanigashira et al. ............. 327/437 |

*Primary Examiner*—Timothy P. Callahan
*Assistant Examiner*—Jung Ho Kim
*Attorney, Agent, or Firm*—Skjerven, Morrill, MacPherson, Franklin & Friel; David E. Steuber

[57] ABSTRACT

A bidirectional battery disconnect switch, i.e., a switch which is capable of blocking a voltage in either direction when open and conducting a current in either direction when closed, is disclosed. The switch includes a four-terminal MOSFET having no source/body short and circuitry for assuring that the body is shorted to whichever of the source/drain terminals of the MOSFET is biased at a lower voltage.

17 Claims, 34 Drawing Sheets

LOW-SIDE BIDIRECTIONAL BATTERY DISCONNECT SWITCH

CROSS-REFERENCE TO RELATED APPLICATIONS

This application is related to application Ser. No. 08/160,560, filed Nov. 30, 1993, now U.S. Pat. No. 5,510,747, application Ser. No. 08/160,539, filed Nov. 30, 1993, now U.S. Pat. No. 5,420,451, and application Ser. No. 08/219,586, filed Mar. 29, 1994, now abandoned, each of which is incorporated herein by reference in its entirety.

FIELD OF THE INVENTION

This invention relates to battery disconnect switches and, in particular, to battery disconnect switches that are entirely bidirectional, i.e., capable of blocking or conducting a current in either direction.

BACKGROUND OF THE INVENTION

A battery disconnect switch is a bidirectional switch that is used for enabling or disabling a current flow between a battery and a load or a battery and a battery charger. Since the battery charger may provide a voltage that is greater than the battery voltage, the switch must be able to prevent a current flow from the charger to the battery when the switch is in an off condition. Conversely, the switch must be able to block a current flow in the opposite direction when the load has a low resistance, when the load is shorted, or when a battery charger has an incorrect output voltage or is connected with the polarity of its terminals reversed.

Moreover, when the switch is turned on, in most situations the switch must be capable of conducting a current in either direction. When the battery is charging, a current flows from the battery charger through the switch to the battery. During normal operation, a current flows through the switch in the opposite direction from the battery to the load. Accordingly, the purpose of the battery disconnect switch is to provide a means to enable or interrupt current conduction between a battery and other electrical devices, regardless of the current or voltage to which the switch is exposed. Current interruption is particularly valuable to provide the following functions: prevent overcharging of a battery; prevent over-discharging of a battery; prevent excessive currents from flowing in the case of a shorted load or battery; protect a battery from improper battery charger connections (such as a reverse connection); extend battery shelf life by minimizing leakage, which will tend to discharge the battery over extended durations; and facilitate sequencing or switching between multiple batteries and multiple loads.

While conventional power MOSFETs (in which the source and body are shorted) may be used to form a battery disconnect switch, the presence of a single P-N junction diode between the drain and the source makes a single power MOSFET incapable of bidirectional current blocking. Since bidirectional current blocking between two or more power sources is a necessary function of all battery disconnect switches, the use of discrete power MOSFETs requires that two devices be placed back-to-back in series, with either a common source or a common drain. The total on-resistance of the switch is then twice that of an individual power MOSFET. Such an arrangement is shown in FIG. 1A, wherein MOSFETs 10 and 11 are connected in a common source configuration.

An alternative is to use a symmetrical drifted lateral MOSFET not having a source/body short. Such an arrangement is described in the above-referenced application Ser. No. 08/219,586, now abandoned, application Ser. No. 08/160,539, now U.S. Pat. No. 5,420,451 and application Ser. No. 08/160,560 now U.S. Pat. No. 5,510,747. An example of this type of arrangement is shown in FIG. 1B wherein a symmetrical MOSFET 12 has one terminal connected to the high side of battery 13 and the other terminal connected to the load. (While MOSFET 12 is symmetrical, the terminal connected to battery 13 is arbitrarily referred to as the drain, and the terminal connected to the load is arbitrarily referred to as the source.) The body of MOSFET 12 is connected to the negative terminal of battery 13, which is normally grounded, so that the drain-to-body diode within MOSFET 12 is reverse biased. The load is connected with its negative terminal directly connected to ground while its positive terminal is connected to the source of MOSFET 12. As a result, whether MOSFET 12 is off or on, its source-to-body diode, like its drain-to-body diode, remains reverse biased under all normal conditions.

MOSFET 12 offers a low on-resistance while being able to block current in both directions when it is turned off. Also, since MOSFET 12 is connected to the high side of battery 13, the grounded low side of the battery can form a common conductive plane in a printed circuit board. In many situations, this helps reduce noise and makes the wiring of the printed circuit board relatively straightforward. MOSFET 12 may be turned off easily by grounding its gate. (However, extra circuitry is required to protect against a reversed battery charger condition. An example of such circuitry is described in the above-referenced application Ser. No. 08/219,586, now abandoned. During conduction, the battery voltage increases the reverse bias on the source-to-body junction of MOSFET 12, leading to the well known "body effect" wherein the threshold voltage of the MOSFET increases. Assuming a fixed gate drive voltage, the body effect increases the on-resistance of the device. Also, the gate of MOSFET 12 must be driven above the battery voltage to guarantee a low on-resistance. This requires a charge pump to generate a positive supply above the voltage of the battery (requiring an oscillator which consumes power).

SUMMARY OF THE INVENTION

In accordance with this invention, a bidirectional battery disconnect switch (BDS) is connected to the low side of the battery, which is typically grounded. The BDS includes a switch MOSFET which is symmetrical, having no source/body short.

Circuitry is provided to connect the body of the MOSFET to whichever of the switch MOSFET's terminals is biased more negatively. In a preferred embodiment, this circuitry includes a pair of MOSFETs. A first MOSFET is connected between the battery-side terminal of the switch MOSFET (arbitrarily designated the drain) and the body of the switch MOSFET. A second MOSFET is connected between the body of the switch MOSFET and the load-side terminal of the switch MOSFET (arbitrarily designated the source). The gate of the first MOSFET is connected to the source of the switch MOSFET; the gate of the second MOSFET is connected to the drain of the switch MOSFET. Accordingly, when the drain of the switch MOSFET is at a higher voltage than the source of the switch MOSFET, the second MOSFET is turned on and shorts the body and source of the switch MOSFET. Conversely, when the source of the switch MOSFET is at a higher voltage than the drain of the switch MOSFET, the first MOSFET is turned on and shorts the body and drain of the switch MOSFET.

The switch MOSFET is turned on by connecting its gate to the positive battery voltage and turned off by grounding its gate. In a preferred embodiment, the gate of the switch MOSFET is tied to its body, which is grounded.

When the switch MOSFET is turned on, the voltage difference between its source and drain is relatively small, and neither of the first and second MOSFETs is turned on. This allows the body of the switch MOSFET to float. If enough current is forced into the body of the switch MOSFET while it is turned on, the body potential of the switch MOSFET could conceivably rise above the potential of both its source and drain terminals, thereby forward-biasing both its drain-to-body and source-to-body diodes. This could create an excessive source-to-drain current in the switch MOSFET and could damage the device.

A second pair of MOSFETs is used to prevent this from happening. This pair includes a third MOSFET, which is connected in parallel with the first MOSFET, and a fourth MOSFET, which is connected in parallel with the second MOSFET, the respective gates of the third and fourth MOSFETs being tied to the body of the switch MOSFET.

BRIEF DESCRIPTION OF THE DRAWINGS

FIG. 7A illustrates the conditions in which the MOSFET linking the body and drain of the switch MOSFET will be turned on.

FIG. 7B illustrates the situation in which the MOSFET linking the body and source of the switch MOSFET will be turned on.

DESCRIPTION OF THE INVENTION

Figure 1A:
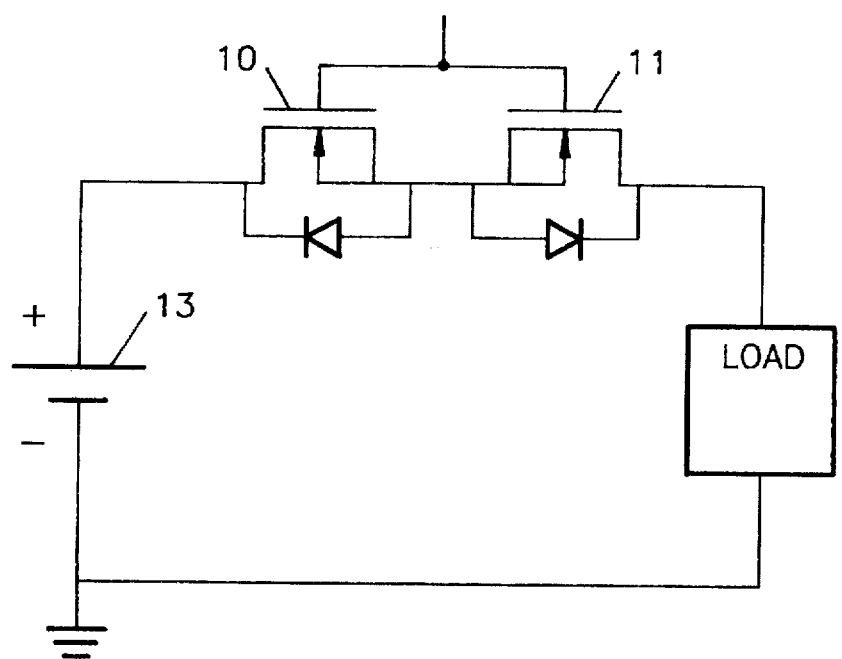
FIG. 1A illustrates a conventional battery disconnect switch which includes a pair of MOSFETs connected back-to-back.
Figure 1B:
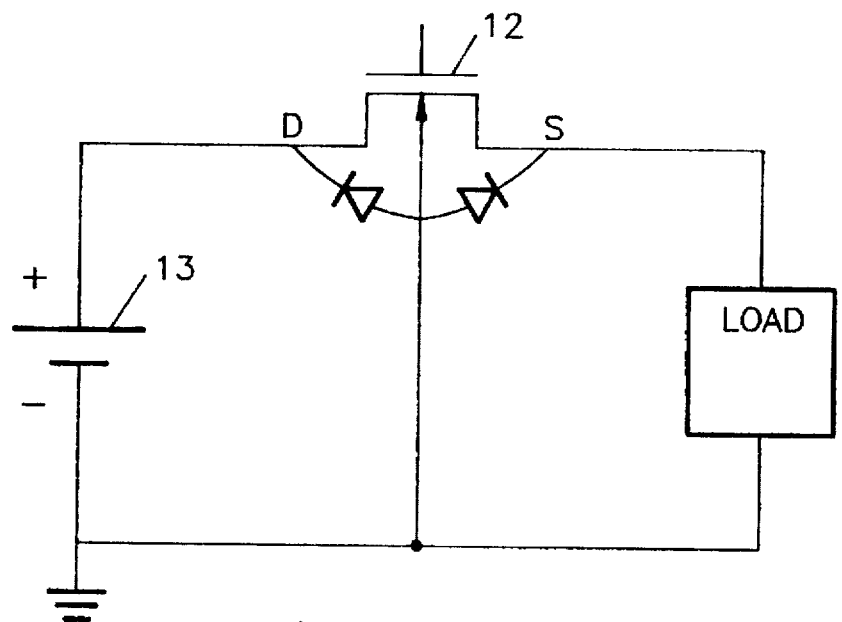
FIG. 1B illustrates a prior art battery disconnect switch which includes a single MOSFET not having a conventional source/body short.
Figure 2:
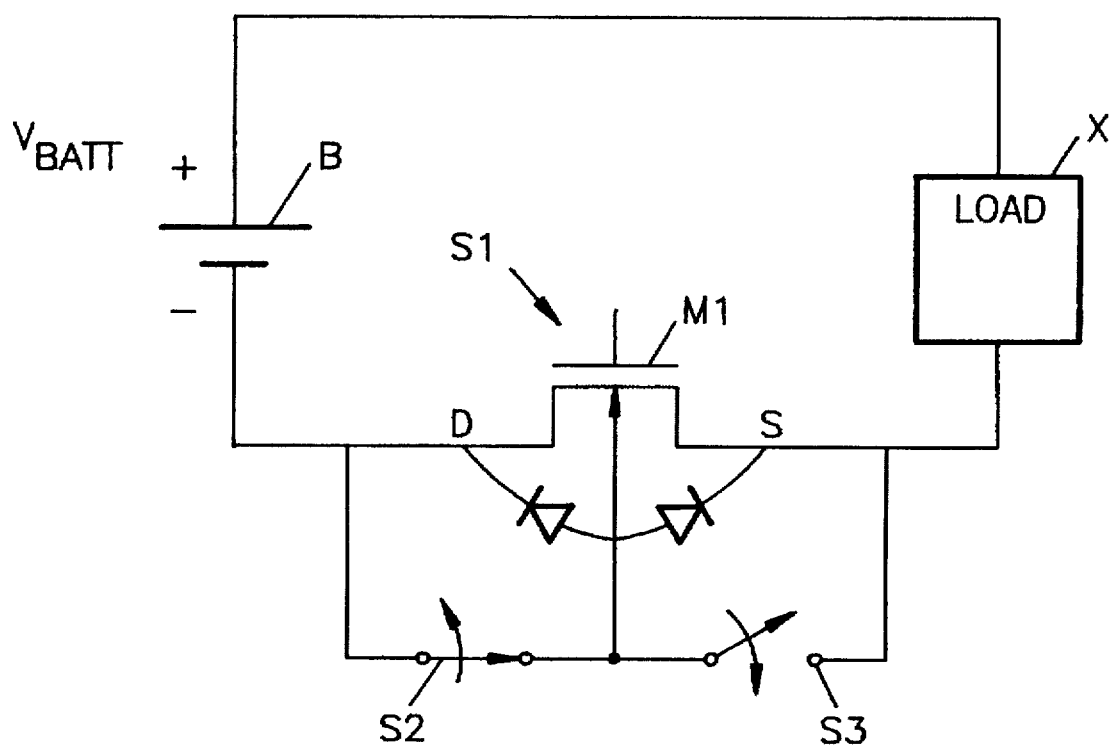
FIG. 2 illustrates conceptually a battery disconnect switch in accordance with this invention.

FIG. 2 illustrates a bidirectional battery disconnect switch S1 in accordance with this invention. Switch S1 is a "low side" switch in the sense that it is connected to the "low" or negative side of a battery B. A load X is connected to the "high" side or positive terminal of battery B. Switch S1 includes a switch power MOSFET M1 which is a symmetrical device, not having a conventional source-body short. The terminal of MOSFET M1 which is connected to battery B is referred to as the drain terminal, and the terminal of MOSFET M1 which is connected to the load X is referred to as the source terminal. These designations are somewhat arbitrary because, switch S1 being bidirectional, either terminal could be more positive in a given situation.

Battery disconnect switch S1 also includes a switch S2 connected between the body and drain of MOSFET M1 and a switch S3 connected between the body and source of MOSFET M1. Switch S2 can be closed and switch S3 can be open, as shown in FIG. 2 or, alternatively, switch S2 can be open and switch S3 can be closed. Switches S2 and S3 are never closed simultaneously because in that event MOSFET M1 would be short circuited. Switches S2 and S3 operate so as to short the body of MOSFET M1 to whichever of its drain and source terminals is at a lower voltage. Thus, as shown in FIG. 2, switch S2 would be closed when the drain of MOSFET M1 is at a lower voltage than its source. Switch S1 is turned on by applying the voltage at the positive terminal of battery B to the gate of MOSFET M1. Switch S1 is turned off by connecting the gate of MOSFET M1 to the body of MOSFET M1. (Depending on which of switches S2 and S3 is closed, the gate is also connected to the source or drain of MOSFET M1, whichever is biased more negatively.) When the gate of MOSFET M1 is connected to the positive terminal of battery B, switch S1 is turned on and will conduct current in either direction, depending on the relative voltages at the drain and source of MOSFET M1.

The body and gate voltages of MOSFET M1 should be selected to assure that MOSFET M1 is turned off whenever this is desired, regardless of the voltages at the source and drain of MOSFET M1. Unwanted conduction in an "off" switch can lead to overcharging or unavoidable discharging of a battery. The gradual discharging of a battery cell shortens the battery life. In some battery technologies such as the lithium ion technology, over-discharging may actually damage the battery cell permanently. Overcharging may also present a safety hazard.

Figure 3A:
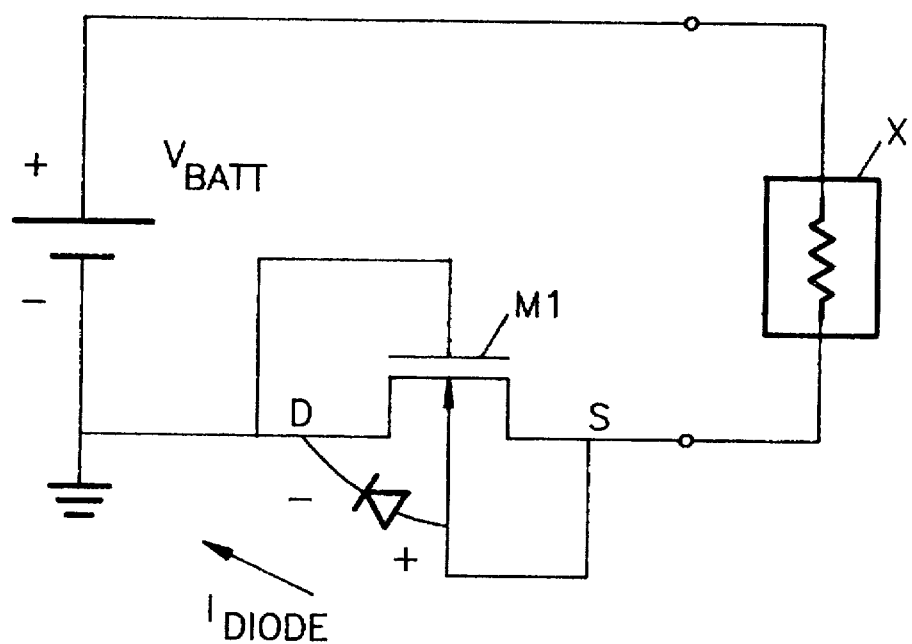
FIGS. 3A and 3B illustrate ways in which unwanted conduction may occur in a battery disconnect switch.
Figure 3B:
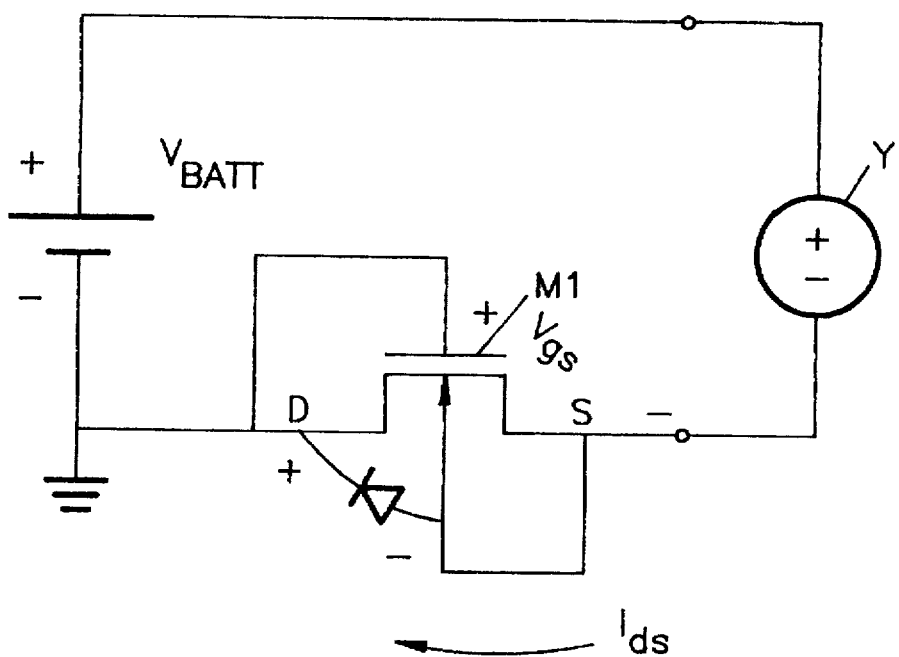

FIGS. 3A and 3B illustrate two ways in which unwanted conduction may occur. In FIG. 3A, the body of MOSFET M1 is connected to its source terminal when the source terminal is biased positively with respect to the drain terminal. In this situation, a current will flow in MOSFET M1 despite the fact that the MOSFET is turned off, i.e., its gate is tied to the more negative drain potential. The diode between the body and drain of MOSFET M1 is forward-biased and, assuming that the load has a resistance approaching zero, a significant current $I_{diode}$ will flow through MOSFET M1.

In FIG. 3B a battery charger Y is connected in the circuit. If battery charger Y has a voltage which is greater than the battery voltage $V_{batt}$, the source of MOSFET M1 will be negatively biased with respect to its drain. Here the body of MOSFET M1 is shorted to its source but its gate is connected to the more positively biased drain of MOSFET M1. The gate bias $V_{gs}$ of MOSFET M1 is therefore equal to the difference between $V_{charger}$ and $V_{batt}$. If the on-resistance of MOSFET M1 is low, even a small voltage mismatch between battery charger Y and battery B will allow amperes of current to flow through MOSFET M1 even though its gate is at ground potential.

Even worse is a combination of improper body and gate connections in MOSFET M1, as a result of which both a channel current and a diode current may flow through MOSFET M1.

Accordingly, a battery disconnect switch in its off condition must prevent a channel current while preventing either of its intrinsic P-N body diodes from becoming forward-biased. Even in the "on state", it is desirable for the intrinsic diodes in the MOSFET to remain reverse-biased. In accordance with this invention, the solution to this problem is to provide circuitry which in effect determines whether the source or the drain of the MOSFET is more negative and then connects the body of the MOSFET to the more negative potential, thereby shunting the forward-biased diode by another smaller MOSFET. The other diode in the MOSFET then is reverse-biased, and parasitic conduction is avoided.

Figure 4A:
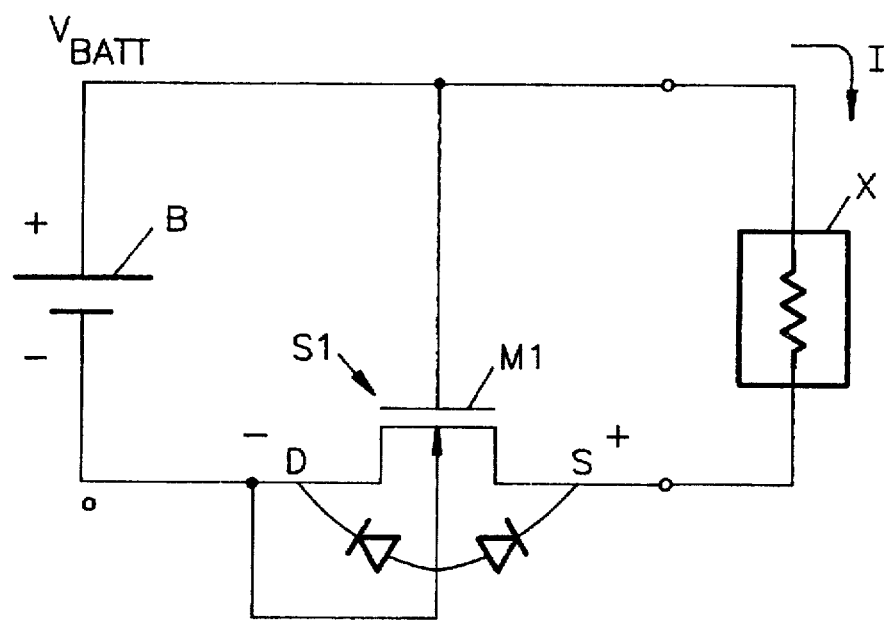
FIGS. 4A–4H illustrate the required connection of the body of the MOSFET in the battery disconnect switch, for a variety of on and off switch conditions.
Figure 4B:
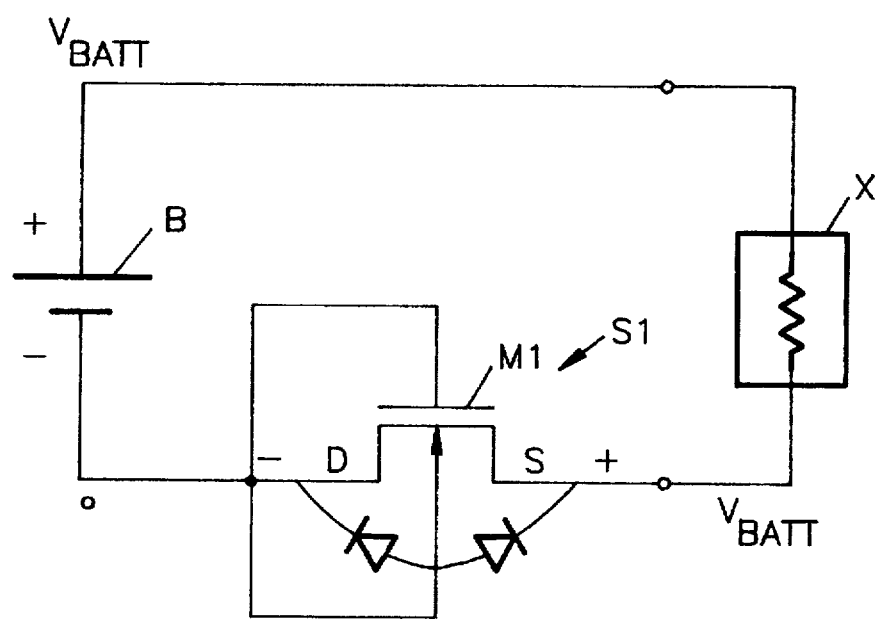

FIGS. 4A-4H illustrate the required body connection for a variety of on and off switch conditions. FIG. 4A shows the normal condition in which the load X is connected to the circuit and the switch S1 is turned on. The voltage across the switch S1 is therefore relatively small. Nonetheless, the battery side (drain) of the switch S1 is at the more negative potential, and the body must therefore be connected to the drain of MOSFET M1. The gate of the MOSFET is connected to $V_{batt}$. In the comparable "off" situation illustrated in FIG. 4B, essentially the entire battery voltage appears across switch S1. The gate of MOSFET M1 is connected to its body, which is shorted to its drain.

Figure 4C:
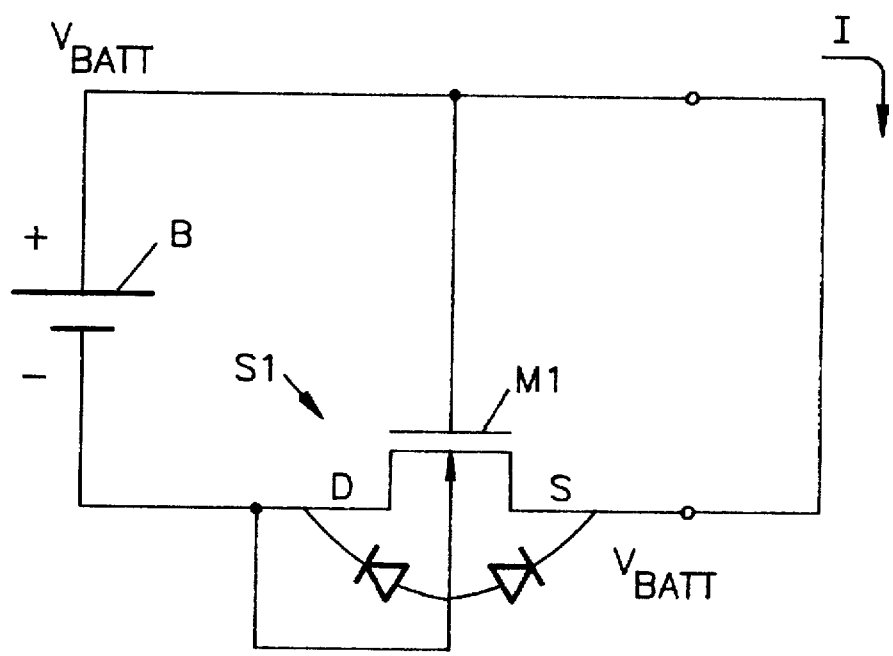
Figure 4D:
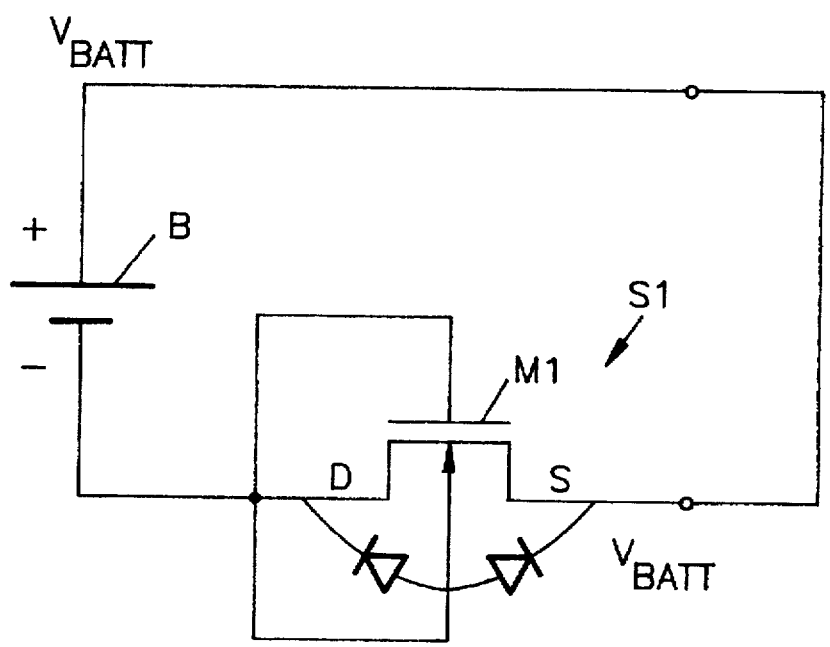

FIGS. 4C and 4D illustrate the situation in which the load is shorted. Assuming that switch S1 is turned on when the short occurs, the entire battery voltage will be present momentarily across MOSFET M1. Since the gate and drain of MOSFET M1 are shorted, MOSFET M1 saturates and dissipates high power levels. If this is left unchecked, heating will quickly destroy the device, assuming that the bond wires can handle the current. If the overcurrent condition is detected by the drive circuitry (see FIG. 7C), the MOSFET can be quickly turned off by shorting its gate to its body, as shown in FIG. 4D. In the off condition, MOSFET M1 withstands the voltage $V_{batt}$ across its terminals.

Figure 4E:
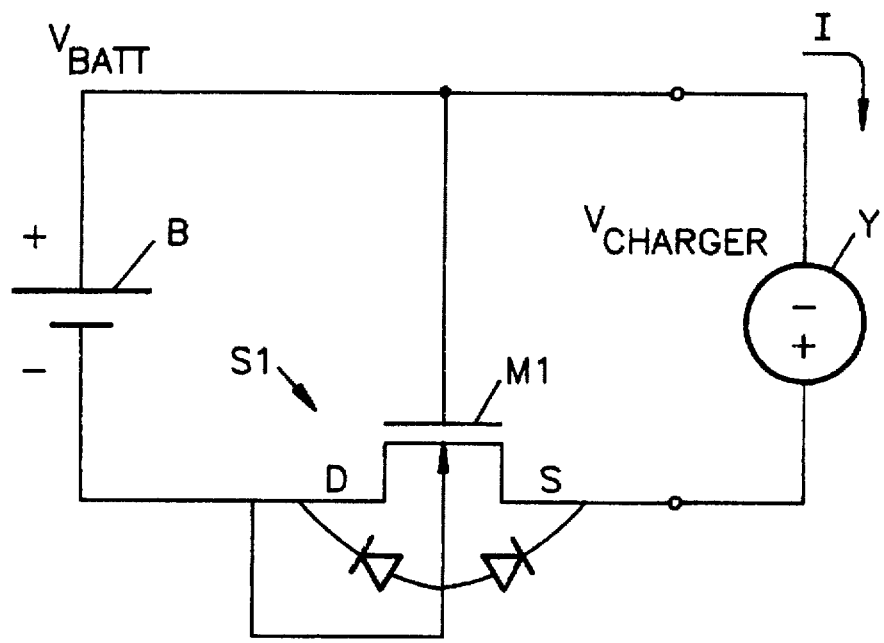
Figure 4F:
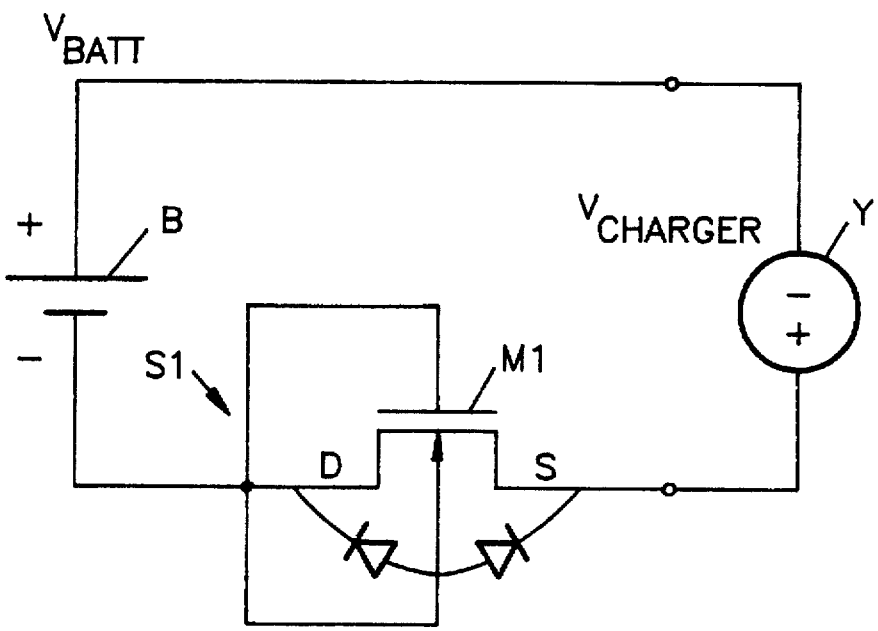

The highest voltages appear across switch S1 when battery charger Y is connected in reverse. At the onset of the reverse connection, when switch S1 is on, a high current results. This situation is illustrated in FIG. 4E and is similar to the situation shown in FIG. 4C. The maximum voltage present momentarily across switch S1 depends on the current-voltage characteristics of charger Y. The maximum voltage will be in the range between $V_{batt}$ and 2 $V_{batt}$. After the fault condition is detected and switch S1 is opened, as shown in FIG. 4F, the current through switch S1 drops to zero. In this condition, switch S1 encounters the summation of $V_{batt}$ and the voltage across the battery charger, which may be as high as 2 $V_{batt}$. The terminal of M1 connected to the charger (i.e., the "source" terminal) becomes the more positive terminal and the "drain" terminal becomes the more negative terminal of MOSFET M1. The body of MOSFET M1 should therefore be shorted to its drain terminal. Provided that proper gate control circuitry is included, that circuitry detects the overcurrent condition and opens switch S1, as in the case of a shorted load (FIG. 4C). The maximum voltage across switch S1 in the shorted load case, however, is only $V_{batt}$, while the voltage in the case of a reversed battery charger is potentially twice that value. If the battery charger has a high series resistance, the discharging current may not trip the overcurrent protection circuitry, in which case the battery charge will be depleted.

Figure 4G:
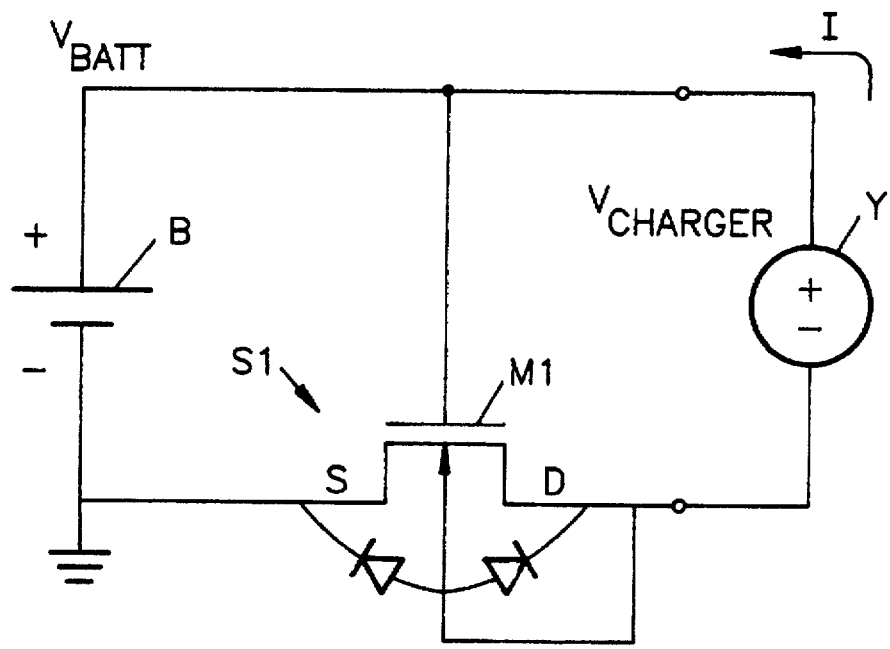
Figure 4H:
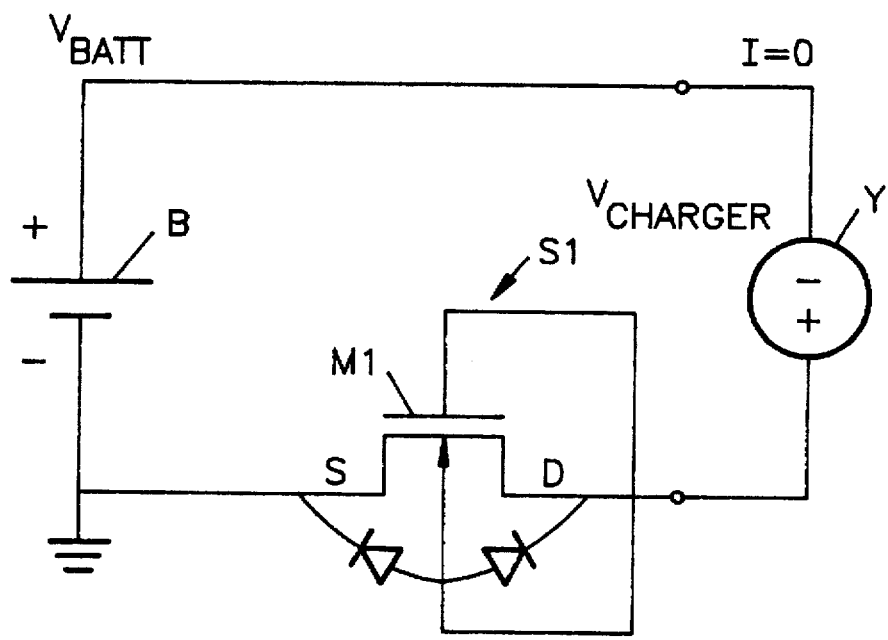

FIGS. 4G and 4H show the situation with battery charger Y properly connected. As the battery voltage increases during current-limited charging, so too does the charger voltage. In this case, the body of switch S1 should theoretically be tied to its drain, since the drain is most negatively biased. In reality, the body connection during conduction is relatively unimportant because the voltage drop across switch S1 is very small.

When battery charger Y no longer supplies a charging current, as shown in FIG. 4H, either due to overcharging of battery B or some fault condition, the voltage of battery charger Y will likely increase to a voltage larger than the battery voltage, i.e., $V_{charger}$ is greater than $V_{batt}$. Since the battery B and charger Y share a common positive terminal, the charger Y pushes the drain of switch S1 to a voltage below the negative terminal of battery B. That is, the drain of MOSFET M1 becomes the most negatively biased point in the circuit. The body of MOSFET M1 must therefore be connected to the drain to avoid unwanted conduction. The voltage across switch S1 is equal to the difference between $V_{charger}$ and $V_{batt}$. At the commencement of charging this voltage difference could be as high as 8.0 to 9 V. After charging, the difference would typically be no greater than 0.5 V, depending on the type of battery charger.

To summarize the situations illustrated in FIGS. 4A–4H, the only condition where the body of MOSFET M1 is not connected to the negative terminal of battery B (i.e., the "drain" of the MOSFET) is where a battery charger is connected in a correct polarity. In the latter event, the body of MOSFET M1 is connected to the negative terminal of the charger (i.e., the "source" of the MOSFET). Whenever switch S1 is turned on, its gate is biased to the positive battery voltage ($V_{batt}$) and when switch S1 is turned off, its gate is tied to its body.

Thus, what is needed to perform this function is a pair of switches that will short the body of the MOSFET to either the source or drain terminal, whichever is biased more negatively. In addition, the switches must satisfy the following conditions:

1. The switches should never be on at the same time or they will provide a path parallel to the power MOSFET which will allow a leakage to flow in the battery disconnect switch in its off state.

2. The switches cannot allow the voltage of the body to float without risking conduction in the MOSFET due to subthreshold channel conduction or forward-biasing of one of its intrinsic diodes. In subthreshold conduction (where the gate of the MOSFET is tied to its body), a gate-to-body voltage which turns on the MOSFET develops anytime the gate floats to a potential more positive than the source. Even at 0.5 V of enhancement, the large transconductance of a low on-resistance switch can produce hundreds of milliamps of channel current. Beyond a gate voltage $V_{gs}$ of 0.6 V, partial forward-biasing of either the drain-to-body or source-to-body diode will lead to excessive currents which may be further amplified by impact ionization or by double injection (wherein the parasitic NPN bipolar transistor present in all N-channel MOSFETs conducts).

These two requirements are somewhat inconsistent. The first requires that one of the switches open before the other closes, and during this period the body will necessarily float. In either case, a drain-to-source current leakage may occur in the MOSFET M1, and this may allow a battery to become overcharged or overdischarged. What is needed is an arrangement which has an extremely small, but non-zero "deadband" (i.e., the voltage range in which neither switch conducts) at all times and under all variations in manufacturing.

Figure 5:
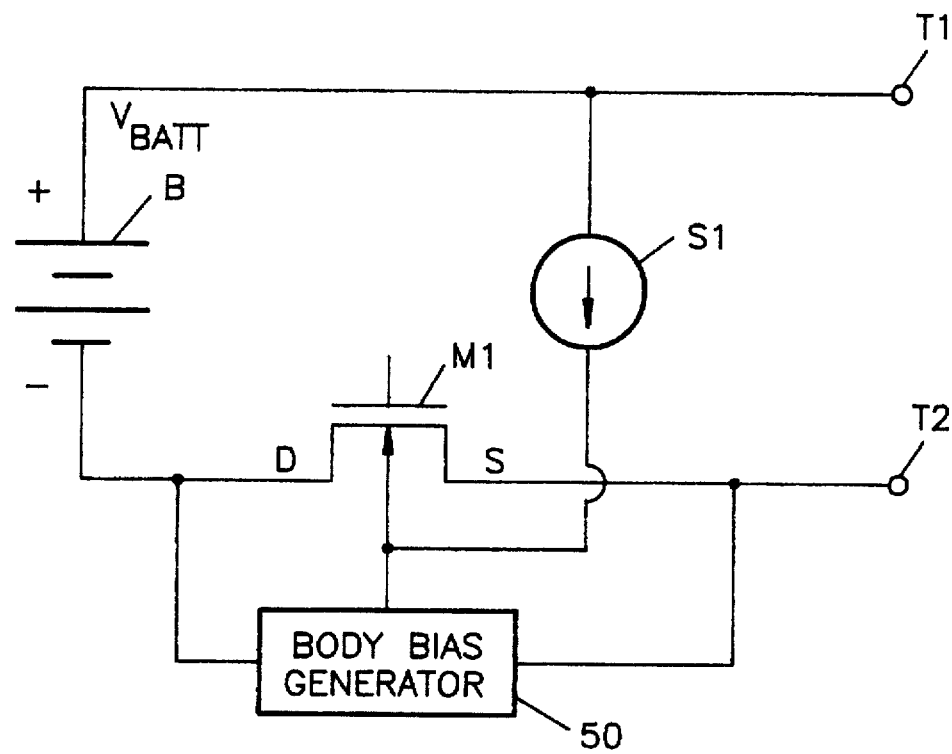
FIG. 5 illustrates a conceptual block diagram of a battery disconnect switch in accordance with this invention, including a body bias generator and a current source which represents the body current in the power MOSFET.

FIG. 5 illustrates a block diagram of a body bias generator 50 which connects the body of MOSFET M1 to its source or drain terminal in accordance with the above-described conditions. Current source 51 represents schematically the current from any integrated circuit or gate buffer used to control the condition of MOSFET M1 which the body terminal of the MOSFET M1 must sink. Terminals T1 and T2 are connected to a load or battery charger.

Figure 6:
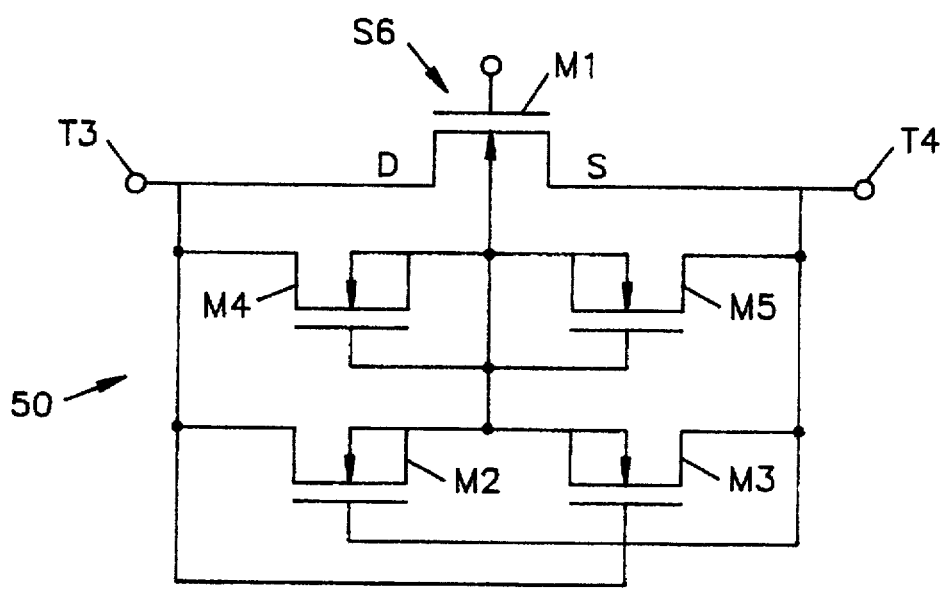
FIG. 6 illustrates a circuit diagram of a battery disconnect switch in accordance with this invention.

FIG. 6 illustrates a circuit diagram of an embodiment according to the invention. Battery disconnect switch S6 includes switch MOSFET M1 and body bias generator 50. A terminal T3 is connected to the negative terminal of a battery and a terminal T4 is connected to a load or battery charger. Body bias generator 50 includes a first pair of MOSFETs M2 and M3 and a second pair of MOSFETs M4 and M5.

MOSFET M2 is connected between the drain and body of MOSFET M1, and MOSFET M3 is connected between the source and body of MOSFET M1, with the source terminals of MOSFETs M2 and M3 being connected to the body of MOSFET M1. MOSFETs M2 and M3 contain a conventional source-body short. The gate of MOSFET M2 is connected to the source of MOSFET M1, and the gate of MOSFET M3 is connected to the drain of MOSFET M1.

MOSFETs M4 and M5 are connected in parallel with MOSFETs M2 and M3, respectively. The gate terminals of MOSFETs M4 and M5, however, are connected in common to the body of MOSFET M1. The source and body terminals of MOSFETs M4 and M5 are shorted in the conventional manner to the body of MOSFET M1.

MOSFETs M2 and M3 function to short the body of MOSFET M1 to whichever of the source and drain terminals of MOSFET M1 is at a lower voltage. MOSFETs M4 and M5 function to prevent the body of MOSFET M1 from "floating" upward to an excessive degree when MOSFETs M2 and M3 are both turned off.

Figure 7A:
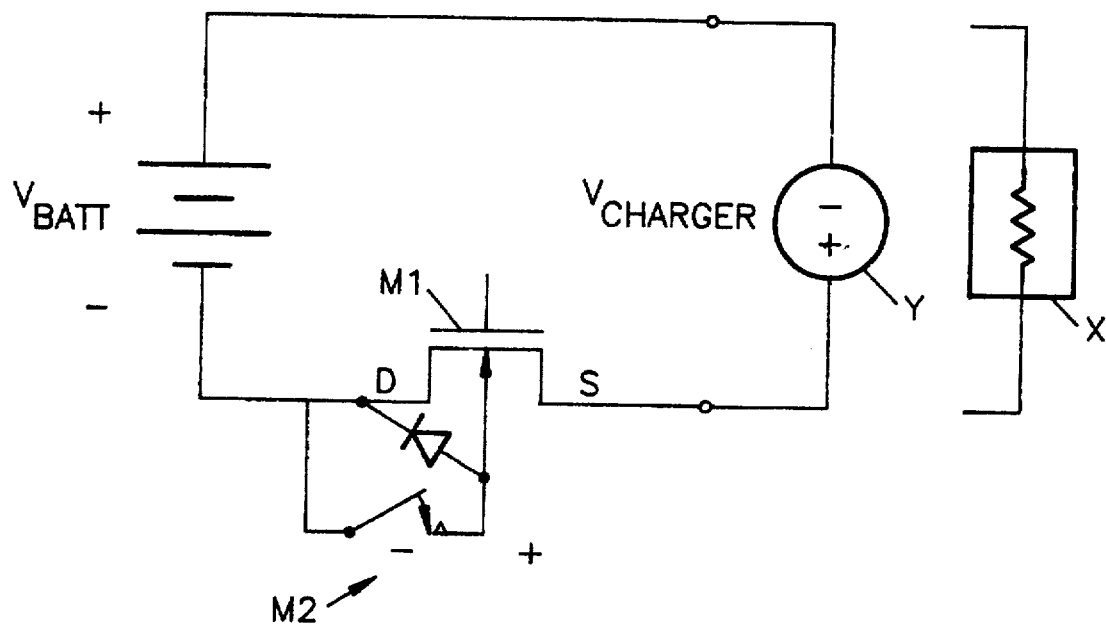
Figure 7B:
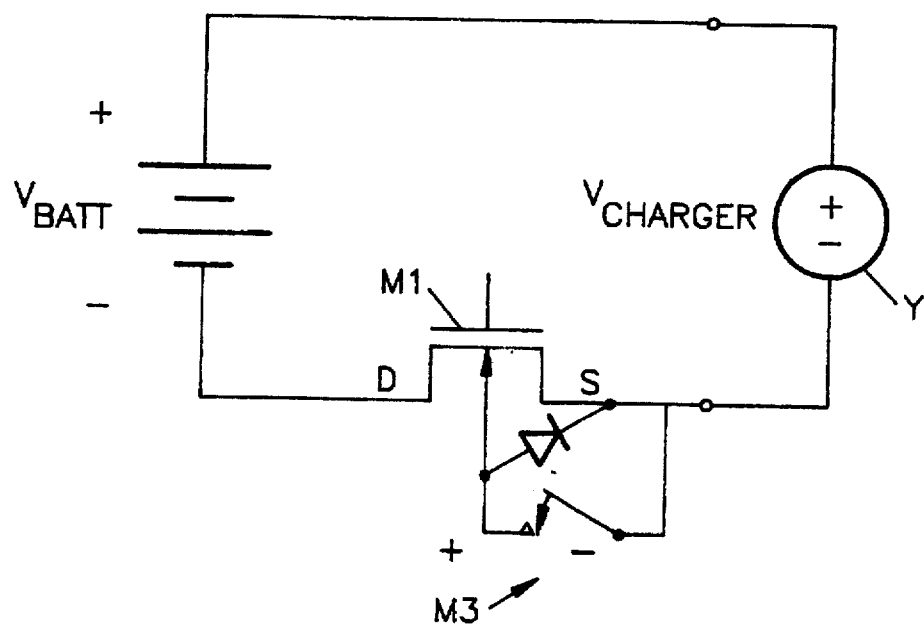

The operation of MOSFETs M2 and M3 will be described first. Because the gate terminals of MOSFETs M2 and M3 are cross-coupled to the source and drain terminals of MOSFET M1, respectively, MOSFET M2 will turn on (FIG. 7A) whenever the voltage at the source exceeds the voltage at the drain of MOSFET M1, and MOSFET M3 will turn on (FIG. 7B) whenever the voltage at the drain exceeds the voltage at the source of MOSFET M1. In other words, MOSFET M2 functions to short the drain and body of MOSFET M1 when the voltage at the drain is lower than the voltage at the source of MOSFET M1, and MOSFET M3 functions to short the body and source of MOSFET M1 when the voltage at the source is lower than the voltage at the drain of MOSFET M1. Thus, the coordinated operation of MOSFETs M2 and M3 satisfy condition (1) above, namely the body of MOSFET M1 is clamped to whichever of the drain and source terminals of MOSFET M1 is biased most negatively. This assumes, of course, that the gate-to-source voltage of one of MOSFETs M2 and M3 exceeds the threshold voltage necessary to turn the MOSFET on. The situation when this is not the case, i.e., MOSFETs M2 and M3 are both turned off, is discussed below.

When switch S6 is connected to a load (whether normal or shorted) or a battery charger with its terminals reversed, the drain of MOSFET M1 (or terminal T3) is biased most negatively. The maximum voltage that switch S6 would normally have to withstand for a fully charged battery connected to a load is 8.4 V. In the reversed battery charger condition, switch S1 must withstand a voltage equal to $V_{batt}+V_{charger}$. This voltage normally does not exceed 16.8 V. With an effective overvoltage detection circuit, however, current is not expected to flow for voltages over 8.4 V, and even if it does there should be no problem so long as the current flows during a switching transient where the total power is limited. Both MOSFET M1 and whichever of MOSFETs M2 and M3 is turned off must be able to withstand these voltages.

When the battery charger is properly connected, the negative terminal of the charger (not the battery) is the most negative point in the system, and MOSFET M3 therefore turns on. When MOSFET M1 is off, the voltage across switch S6 is equal to $V_{charger}-V_{batt}$. The open circuit voltage of the battery charger may actually exceed 8.4 V. For a fully discharged battery, this voltage is present across switch S6. As the battery charges, the voltage across switch S6 declines. When the overcharge condition of the battery is detected, the maximum voltage across switch S6 is equal to $V_{charger}-8.4$ V. None of these voltages is large enough to create a problem in switch S6, even when current is flowing (assuming that the maximum power is limited by the battery charger's current compliance circuitry).

Figure 7C:
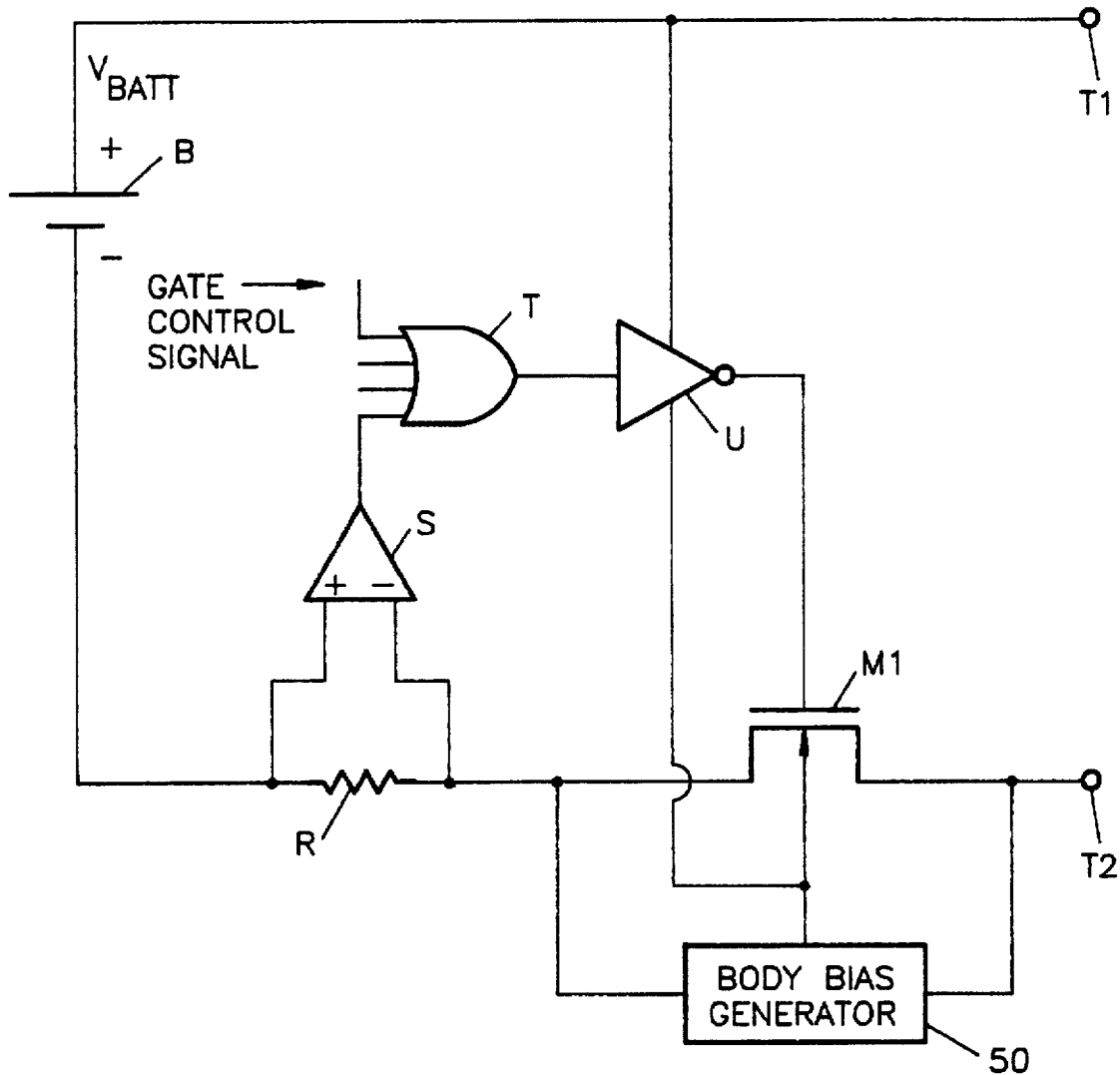
FIG. 7C illustrates a circuit diagram of an overcurrent detection circuit for use in conjunction with the battery disconnect switch.

There are numerous known techniques of controlling the gate voltage on MOSFET M1. As noted above, for example, a overcurrent detection circuit may be required to drive the gate of MOSFET M1 low, thereby turning MOSFET M1 off, when the load is shorted. Such an arrangement is illustrated in FIG. 7C. A resistor R delivers a voltage drop which exceeds a predetermined threshold when an excessive current flows through MOSFET M1. This voltage is detected by a comparator S which delivers an output signal through an OR gate T to an input of an inverter U. Inverter U delivers an output which in effect clamps the gate and body of MOSFET M1. As described elsewhere, this turns MOSFET M1 off. Absent an overcurrent condition, a gate control signal delivered to another input of OR gate T controls the gate of MOSFET M1. When the gate control signal is low, inverter U applies $V_{batt}$ to the gate of MOSFET M1, turning MOSFET M1 on; when the gate control signal is high the gate and body of MOSFET M1 are tied together. Comparator S, OR gate T and inverter U may be included in an integrated circuit, and body bias generator may prevent the forward-biasing of diodes in the integrated circuit. Numerous other methods of controlling the gate of MOSFET M1 so as to satisfy various conditions are known in the art.

Aside from holding the body to the most negative potential in the off state, MOSFETs M2 and M3 must maintain a proper bias of the body of MOSFET M1 in the presence of any impact ionization. Impact ionization occurs in a MOSFET when both current and large voltages are simultaneously present. Such a condition requires the MOSFET to be in its saturation region of operation. Since MOSFET M1 would typically have a low on-resistance and large channel width, the transconductance of the device is very high. Even a modest gate drive puts the device well into its linear region of operation. Accordingly, saturation can only occur when the device is biased with its gate potential near threshold during a transient.

Figure 8:
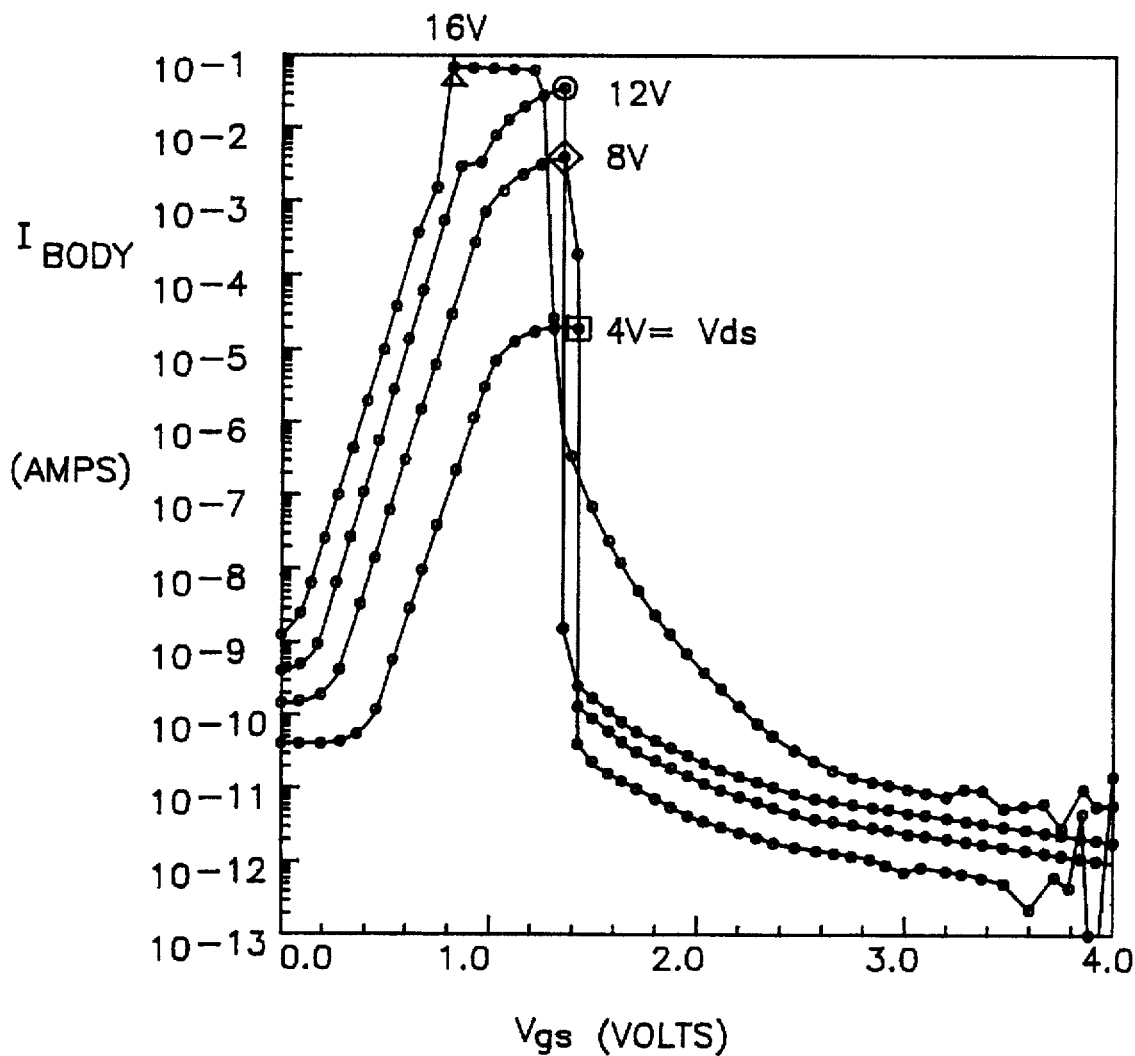
FIG. 8 illustrates a graph showing the experimentally measured body current in the switch MOSFET as a function of gate voltage ($V_{gs}$) for various drain voltages ($V_{ds}$).

FIG. 8 illustrates an experimentally measured body current ($I_{body}$) in MOSFET M1 as a function of gate drive ($V_{gs}$) for various drain biases ($V_{ds}$). For gate potentials above 1.4 V, the device comes out of saturation, the electric fields in the device drop and the body current drops precipitously. When $V_{gs}$ is near zero, the body current is low even though the fields are high. In between these regions is a peak in impact ionization and therefore body current, since conduction current is flowing through regions of high electric field. The effect of impact ionization induced substrate current is discussed in S.M. Sze, *Physics of Semiconductor Devices*, 2nd Ed., Wiley (1981), pp. 482–486. The maximum body current occurs when $V_{gs}\approx 1.3$ V. When $V_{ds}$ is equal to 8 V, the maximum body current is around 3 mA. If the device were to conduct current with a $V_{ds}$ of 16 V, the ionization current increases to several hundred milliamps. These currents are, of course, transient in nature. (The device tested was the V30042 manufactured by Siliconix incorporated.)

Figure 9:
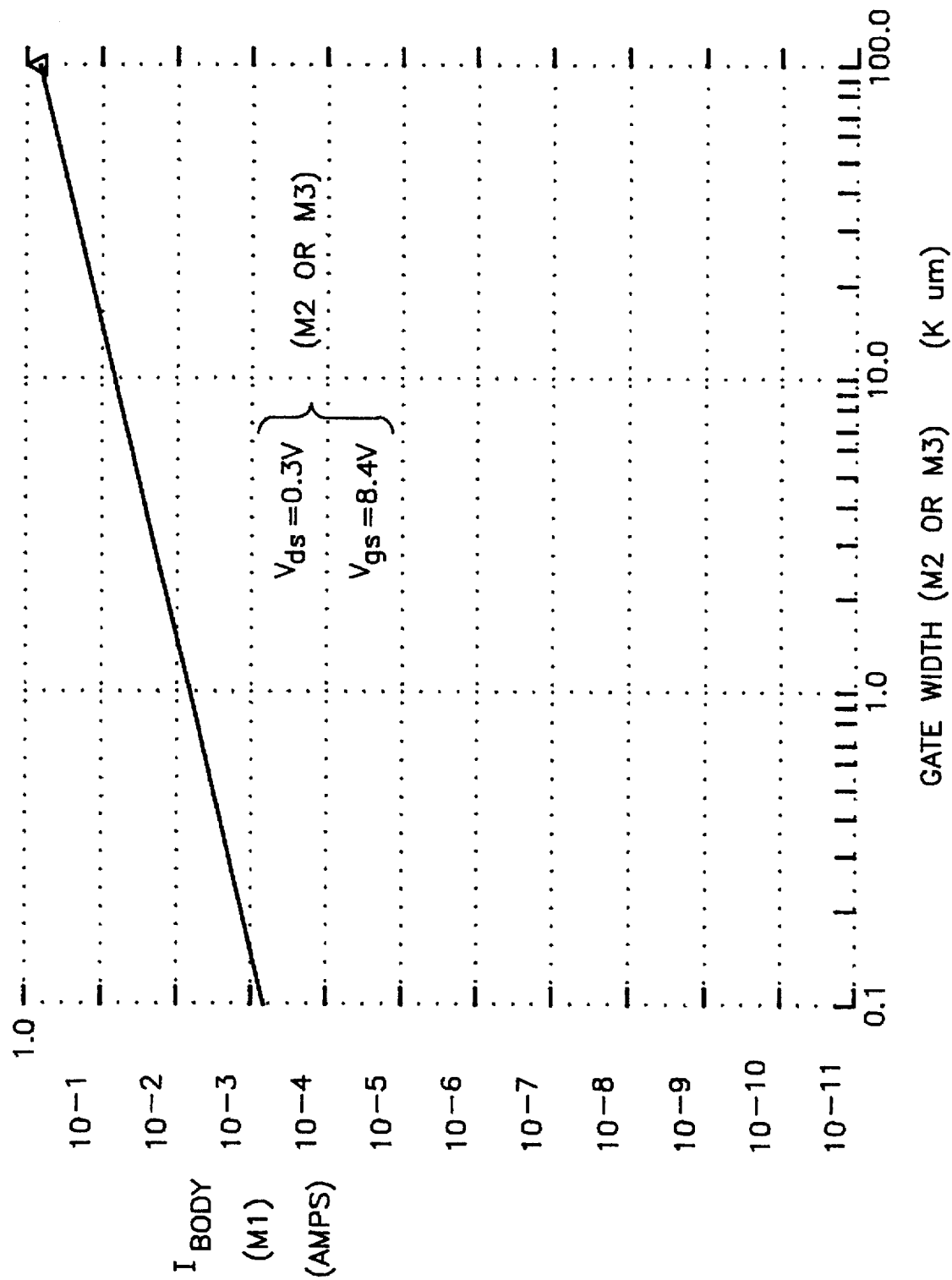
FIG. 9 illustrates a graph showing the gate width of MOSFETs M2 and M3 that is required to sink a specified body current in the switch MOSFET without forward-biasing the source-to-body diode in the switch MOSFETs more than 0.3 V.

FIG. 9 illustrates the relationship between the gate width of MOSFET M2 or M3 and the body current $I_{body}$ of MOSFET M1. $V_{ds}$ of the MOSFET was 0.3 V and $V_{gs}$ was 8.4 V. FIG. 9 shows that the larger the gate width of the MOSFET, the higher the current it can sink without developing any appreciable voltage drop. Using a design criterion of sinking a current transient of at least 100 mA without generating a forward-bias of more than 0.3 V on the source-to-body diode of MOSFET M1, a gate width of at least 10K µm is prescribed. Safe operation was confirmed experimentally under these conditions using a device having a gate width of 11,700 µm.

Figure 10:
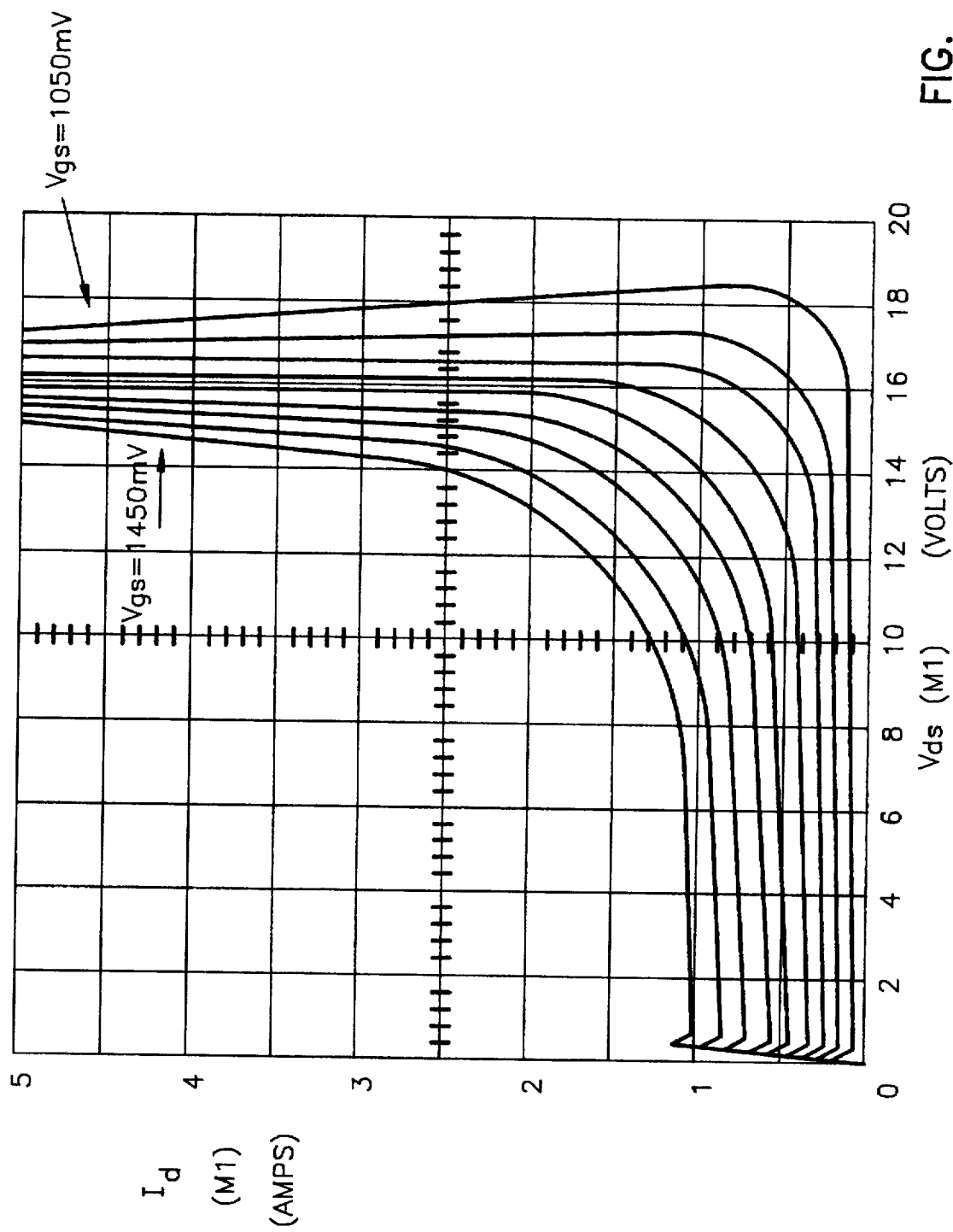
FIG. 10 illustrates a graph showing the current through the switch MOSFET as a function of the drain-to-source voltage at various gate drives.

MOSFETs M2 and M3 also need to prevent forward-biasing of either of the intrinsic diodes in MOSFET M1 when MOSFET M1 approaches the so-called sustaining voltage of its parasitic bipolar transistor. This sustaining voltage of MOSFET M1 is shown in FIG. 10, again using a V30042. In FIG. 10, the horizontal axis represents the drain-to-source voltage $V_{ds}$ of MOSFET M1 and the vertical axis represents the drain current $I_d$ of MOSFET M1. The respective curves represent $I_d$ as a function of $V_{ds}$ as the gate drive $V_{gs}$ varies in increments of 50 mV from 1050 mV to 1450 mV.

Figure 11:
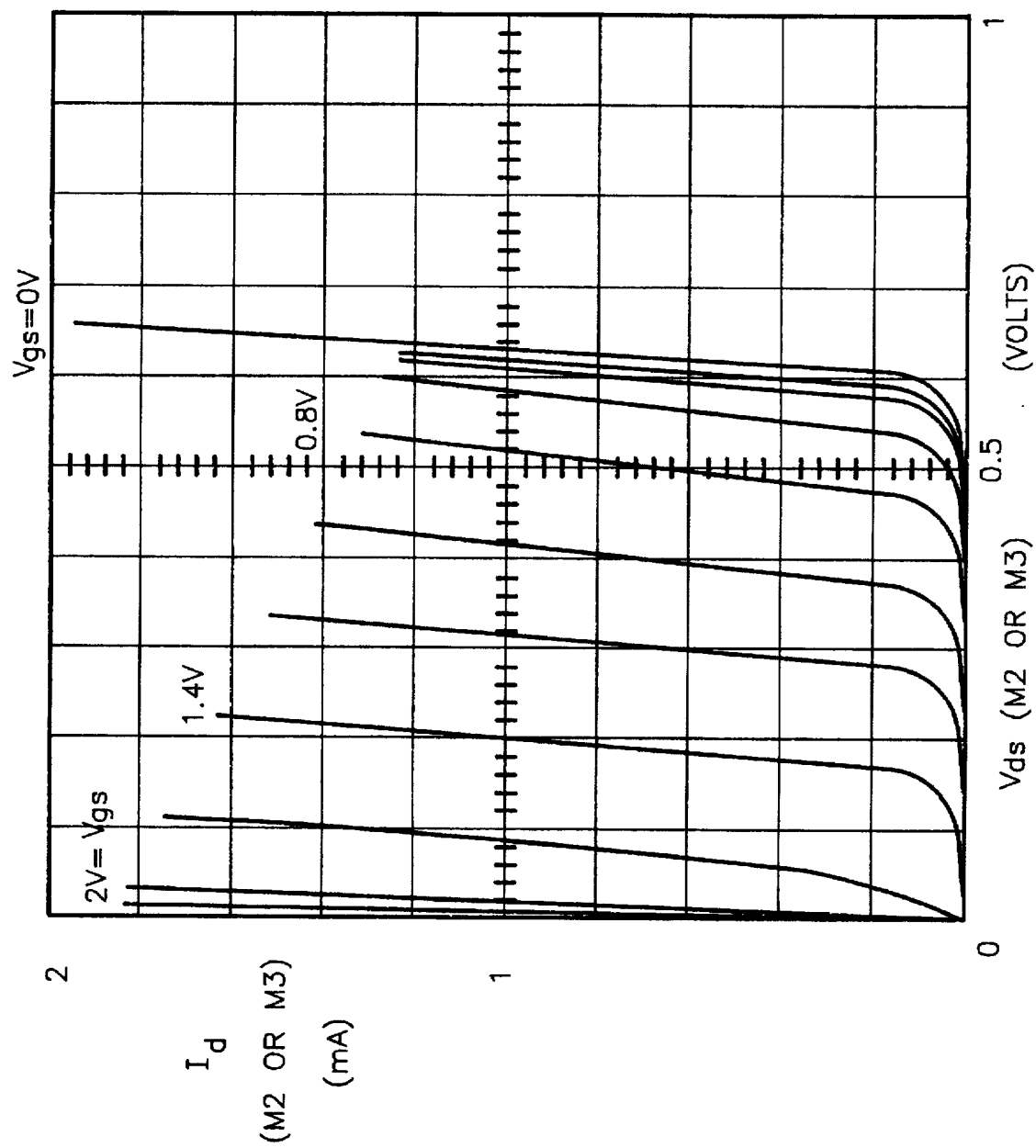
FIG. 11 illustrates a graph showing the current-voltage characteristics of MOSFETs M2 and M3 as a function of gate drive.

When the drain-to-source voltage $V_{ds}$ of MOSFET M1 drops below the threshold voltages of MOSFETs M2 and M3, the latter turn off and allow the body of MOSFET M1 to float. FIG. 11 illustrates the current-voltage characteristics of one of MOSFETs M2 and M3 as a function of gate drive, as the gate drive ($V_{gs}$) varies from 0 V (far right curve) to 2 V. For $V_{gs}<1.4$ V, several hundred millivolts may develop across one of the intrinsic diodes of MOSFET M1. When MOSFET M1 is fully turned on, its total $V_{ds}$ may be only 100 mV, in which case the gate drive $V_{gs}$ of MOSFET M2 or M3 is also close to zero, and the body of MOSFET M1 could float to a full diode voltage of 640 mV, as shown in the far right curve in FIG. 11. If no body current were flowing in MOSFET M1, the lack of a gate drive on MOSFET M2 or M3 would not be a problem, because even a small amount of gate enhancement would turn on MOSFET M2 or M3 slightly, and force the body voltage of MOSFET M1 to the most negative potential.

However, since the IC represented by current source 51 (FIG. 5) also generates current, and some of this current is necessarily carried by the body of MOSFET M1, the body voltage of MOSFET M1 will tend to rise above the lower of its source and drain voltages. If enough current is forced into the body of MOSFET M1 in its on condition, it is conceivable that the voltage of the body could rise above both source and drain, forward-biasing both junctions. In fact, anytime the voltage across switch S6 becomes small, MOSFETs M2 and M3 cannot by themselves keep the intrinsic diodes in MOSFET M1 from becoming forward-biased. The resulting drain current $I_d$ in MOSFET M1 should be small, since the β of the parasitic bipolar transistor is low. The observed current is much higher, however, due to channel conduction in MOSFET M1.

Figure 12:
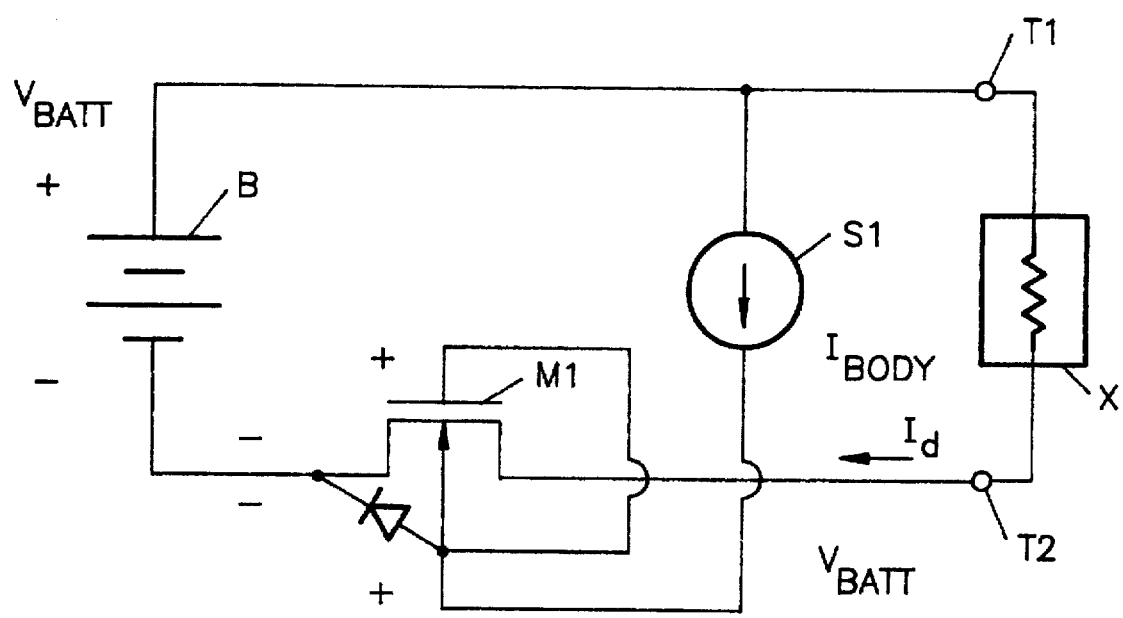
FIG. 12 is a circuit diagram which describes the effect of the body current in the switch MOSFET.

This is illustrated in FIG. 12, wherein current source 51 again represents the body current $I_{body}$ forced into MOSFET M1 by an external source. Assume that the gate of MOSFET M1 is tied to its body and the device is turned off. Sinking a current into the body terminal results in a slight forward-biasing of the body-to-drain diode with a voltage $V_{bd}$. The value of $V_{bd}$ is determined by the following equation:

$$V_{bd} = \frac{kT}{q} \ln \frac{I_{body}}{I_o}$$

wherein K is Boltzmann's constant, T is temperature in °C., Q is the charge of an electron and $I_o$ is the saturation current of a diode.

Figure 13:
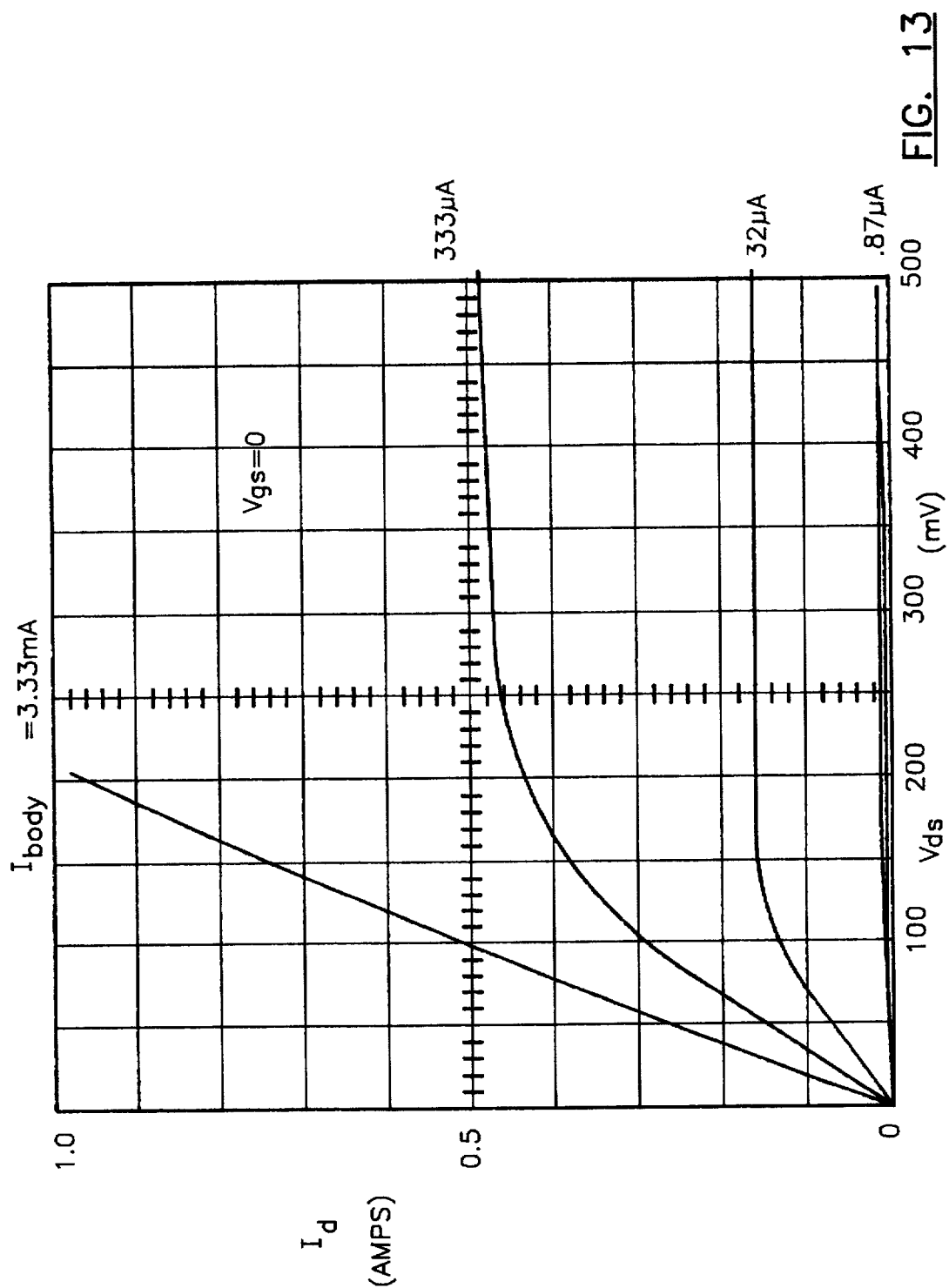
FIG. 13 illustrates a graph showing the drain current $I_d$ in the switch MOSFET as a function of the source-to-drain voltage $V_{ds}$ for different body currents when MOSFETs M2–M5 are absent and the gate and body of the switch MOSFET are tied together.

Because the gate of MOSFET M1 is tied to its body, the gate is also pulled to a more positive potential. This slight gate enhancement of MOSFET M1 is then amplified by the large transconductance of the device. Because the $V_{gs}$ of MOSFET M1 is small, the device is saturated. Even ignoring subthreshold conduction, the resulting current is at least:

$$I_d = \frac{\mu C_{ox} W}{2L} \left\{ \frac{kT}{q} \ln \frac{I_{body}}{I_o} - [V_{to} - \Delta V_t(V_{bd})] \right\}^2$$

Wherein $I_d$ represents the leakage current through MOSFET M1, μ is the channel mobility, Cox is the gate oxide capacitance, W is the channel width, L is the channel length, $V_{to}$ is the threshold voltage $V_t$ absent the body effect and Δ $V_t$ is the shift in $V_t$ caused by the body effect. Because the gate width W of MOSFET M1 is large, a high leakage current $I_d$ can result. FIG. 13 shows the current-voltage characteristics of MOSFET M1 in the off condition ($V_{gs}$=0), as a function of body current. (MOSFET M1 was connected as shown in FIG. 12, without MOSFETs M2–M5.) As FIG. 13 indicates, a body current of 333 μA produces an $I_d$ of 500 mA, resulting in a current gain of 170,000. For 3 mA of body current, MOSFET M1 doesn't even saturate at an $I_d$ of 1 A.

Figure 14:
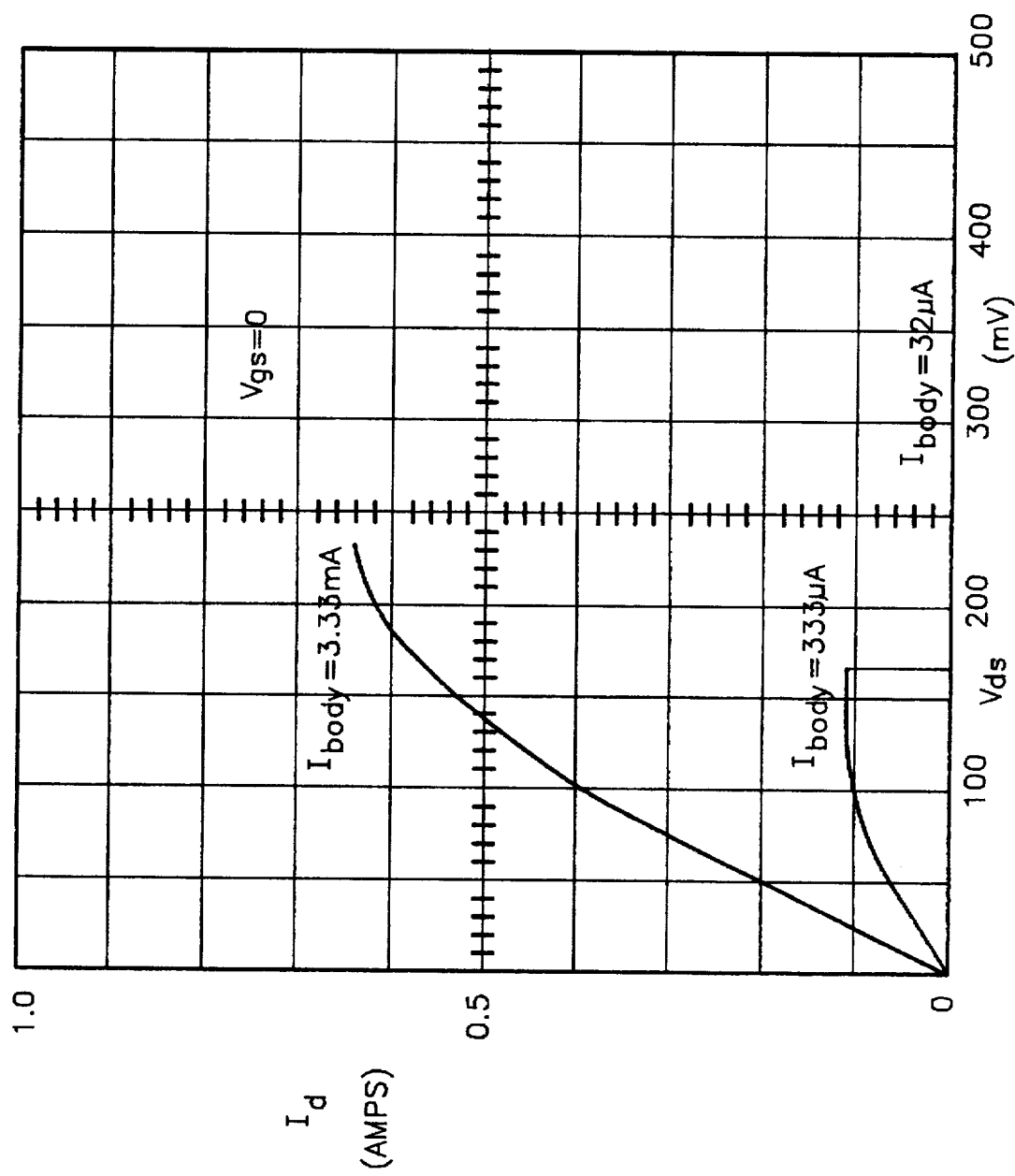
FIG. 14 illustrates a graph showing the drain current $I_d$ in the switch MOSFET as a function of the source-to-drain voltage $V_{ds}$ for different body currents $I_b$ when MOSFETs M2 and M3 are present.
Figure 15:
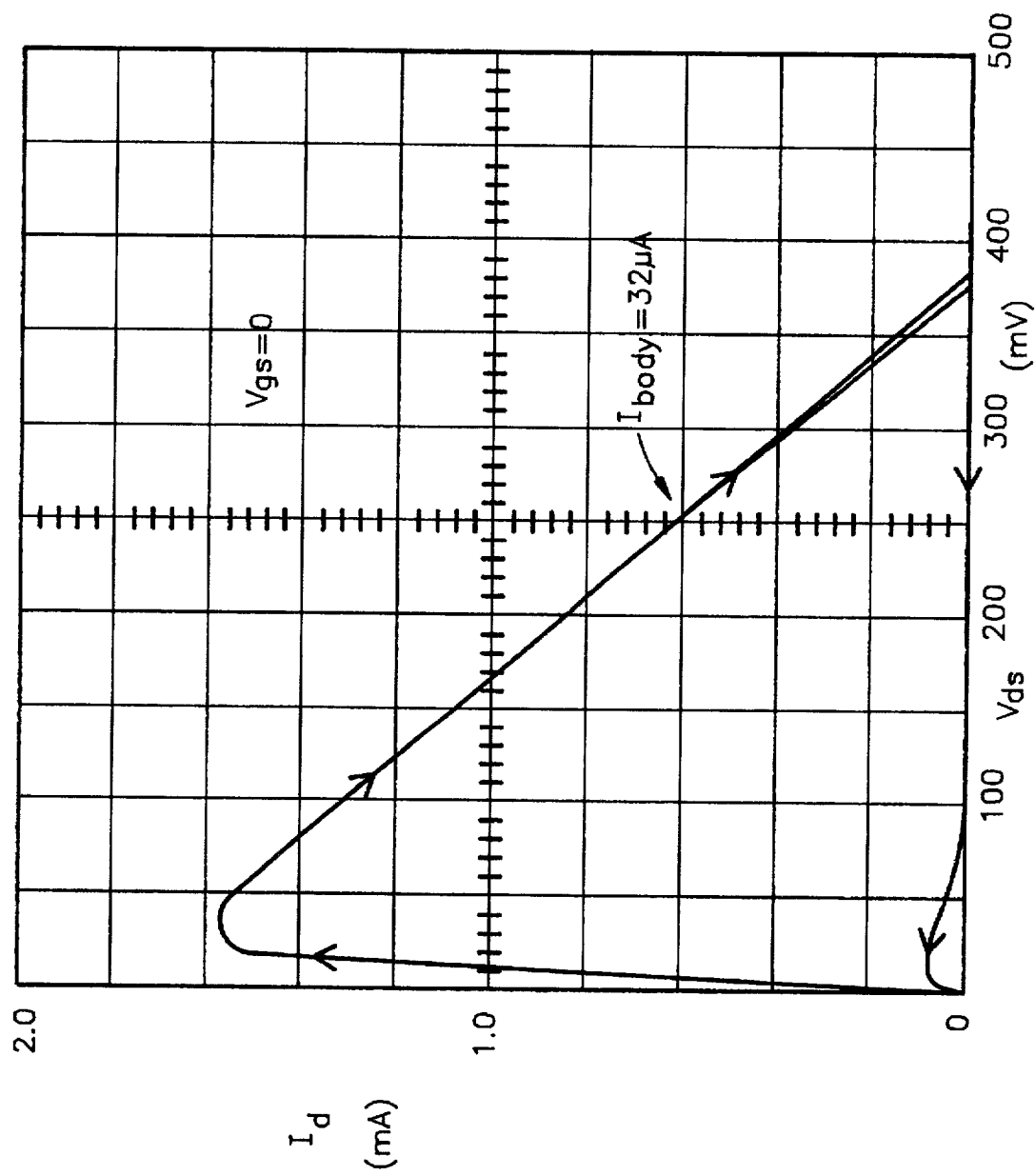
FIG. 15 illustrates a graph of the kind shown in FIG. 14 for a body current $I_{body}=32$ µA.

FIG. 14 shows the same data when MOSFETs M2 and M3 (but not MOSFETs M4 or M5) are connected. The maximum $I_d$ for 333 μA of body current is now reduced to 100 mA. More importantly, this current can only be conducted up to a voltage of about 0.16 V, above which MOSFET M2 turns on and $I_d$ collapses to zero. The curve for $I_{body}$=32 μA is not clearly visible in FIG. 14, but is visible in the more detailed view of FIG. 15. For a body current of 32 μA, the peak $I_d$ is only 1.6 mA and MOSFET M1 begins to turn off at voltages over 80 mV. (Since these curves were generated by a curve tracer, the double line in the curves results from the capacitance of the body.)

Despite these favorable results, it is still desirable to limit even further the ability of the body of MOSFET M1 to float upward when MOSFETs M2 and M3 are both turned off, thereby limiting the leaking current $I_d$ in MOSFET M1 even more. Such is the function of MOSFETs M4 and M5.

Figure 16:
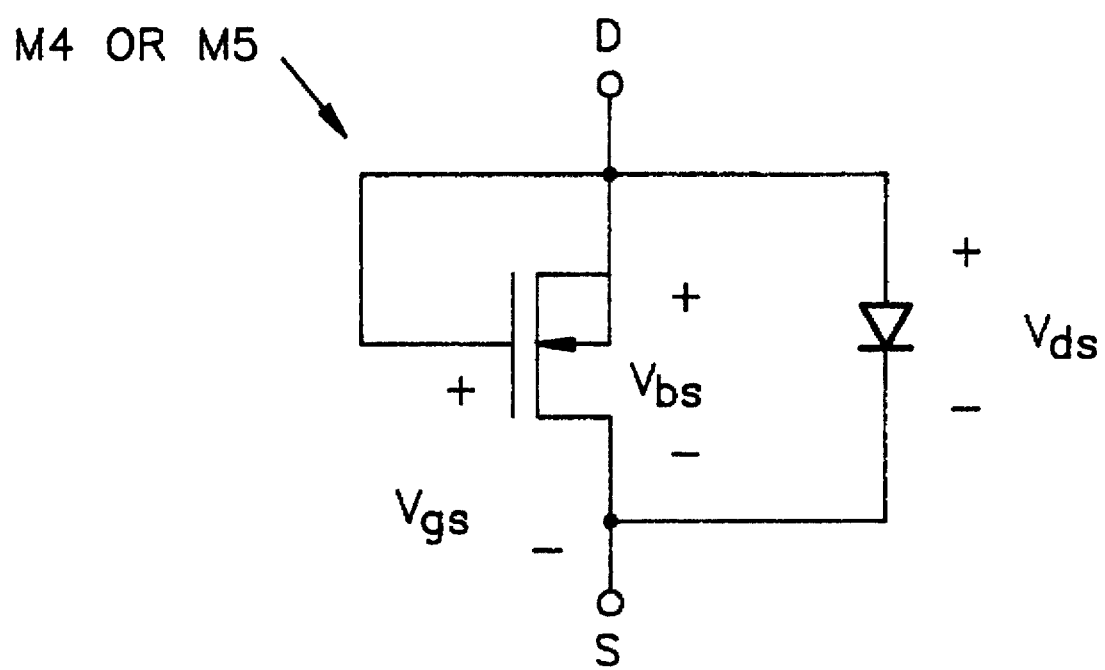
FIG. 16 illustrates a circuit diagram of the operation of MOSFETs M4 and M5.
Figure 17:
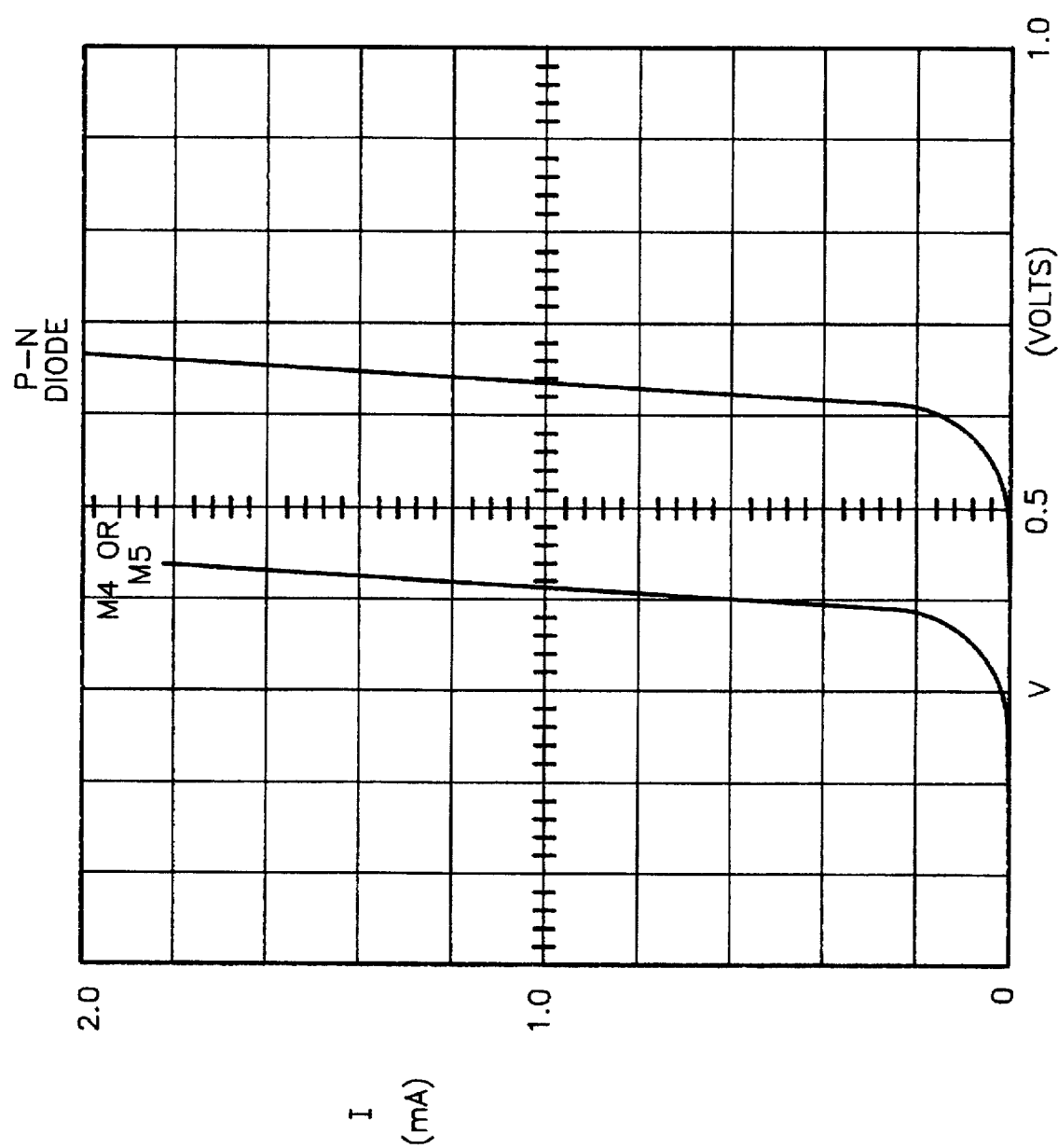
FIG. 17 illustrates a current-voltage diagram which compares the characteristics of MOSFETs M4 and M5 with a conventional P-N diode.

FIG. 16 is a schematic diagram of MOSFET M4 or M5 as connected in the circuit shown in FIG. 6. Since the gate, drain and body of the MOSFETs are shorted together, the MOSFET operates in a manner somewhat similar to a Schottky diode. This is because, when the source-to-body diode in the MOSFET is forward-biased, the voltage barrier at the junction between the source diffusion and the body diffusion is lowered, and the threshold voltage is decreased. This is sometimes referred to as the "anti-body effect", and it occurs in every MOSFET when it is operated in Quadrant 3 (negative $V_{ds}$ and $I_d$). The anti-body effect is normally negligible because it is very small relative to the threshold voltage or the enhancement (gate drive) voltage. When the gate, drain and body of a MOSFET having a large channel width are shorted together, the voltage drop across the resulting two-terminal device is lower than that of a conventional P-N diode. This voltage drop $V_{ds}$, which is lower than $V_{to}$, can be expressed as follows:

$$V_{ds} = V_{to} + \gamma\{\sqrt{2\phi_f - V_{sb}} - \sqrt{2\phi_f}\} - V_{sb}$$

wherein γ is the body effect factor, $\phi_f$ is the Fermi potential (depends logarithmically on the doping $N_A$ of the body, i.e., $\phi_f$=0.026 ln $N_A/n_i$ where $n_i$ is the intrinsic carrier concentration of silicon), and $V_{sb}$ is the source-to-body voltage. FIG. 17 is a current-voltage diagram which compares the characteristics of MOSFETs M4 and M5 with a conventional P-N diode. It indicates that the voltage drop across MOSFETs M4 or M5 when they are forward-biased is approximately 220 mV less than the voltage drop across a forward-biased junction diode. The actual conduction in the MOSFET is the channel current, not minority carrier current, so the MOSFET is also very fast. Moreover, MOSFETs M4 and M5 are fully integratable.

Figure 18:
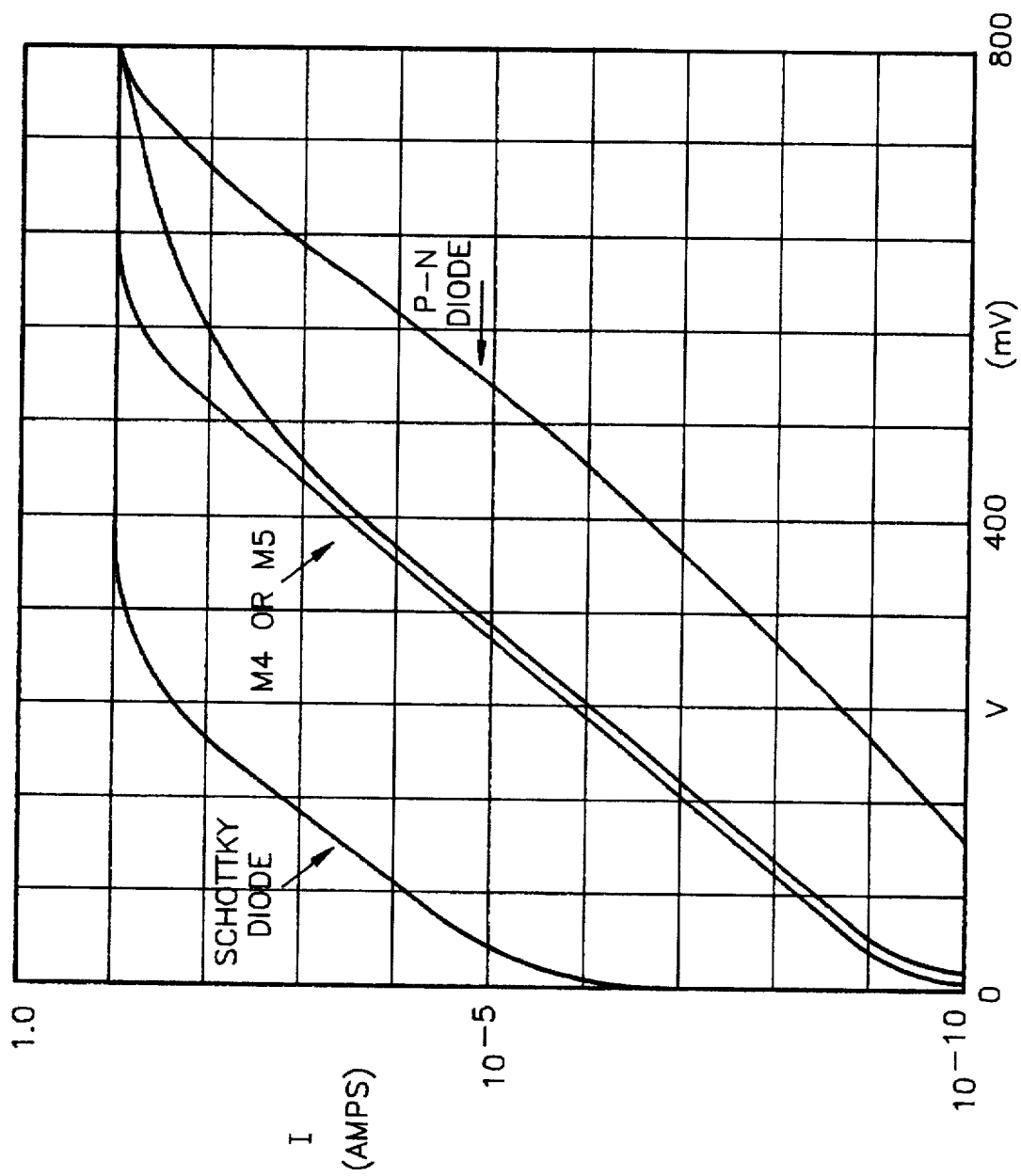
FIG. 18 illustrates a diagram which compares the current-voltage characteristics of MOSFETs M4 and M5 with a conventional P-N diode and with a Schottky diode.

FIG. 18 is a semi-log diagram comparing the current-voltage characteristics of a normal P-N diode, two embodiments of MOSFET M4 or M5, and a Schottky diode.

In some embodiments a Schottky or other type of diode could be substituted for each of MOSFETs M4 and M5.

Figure 19:
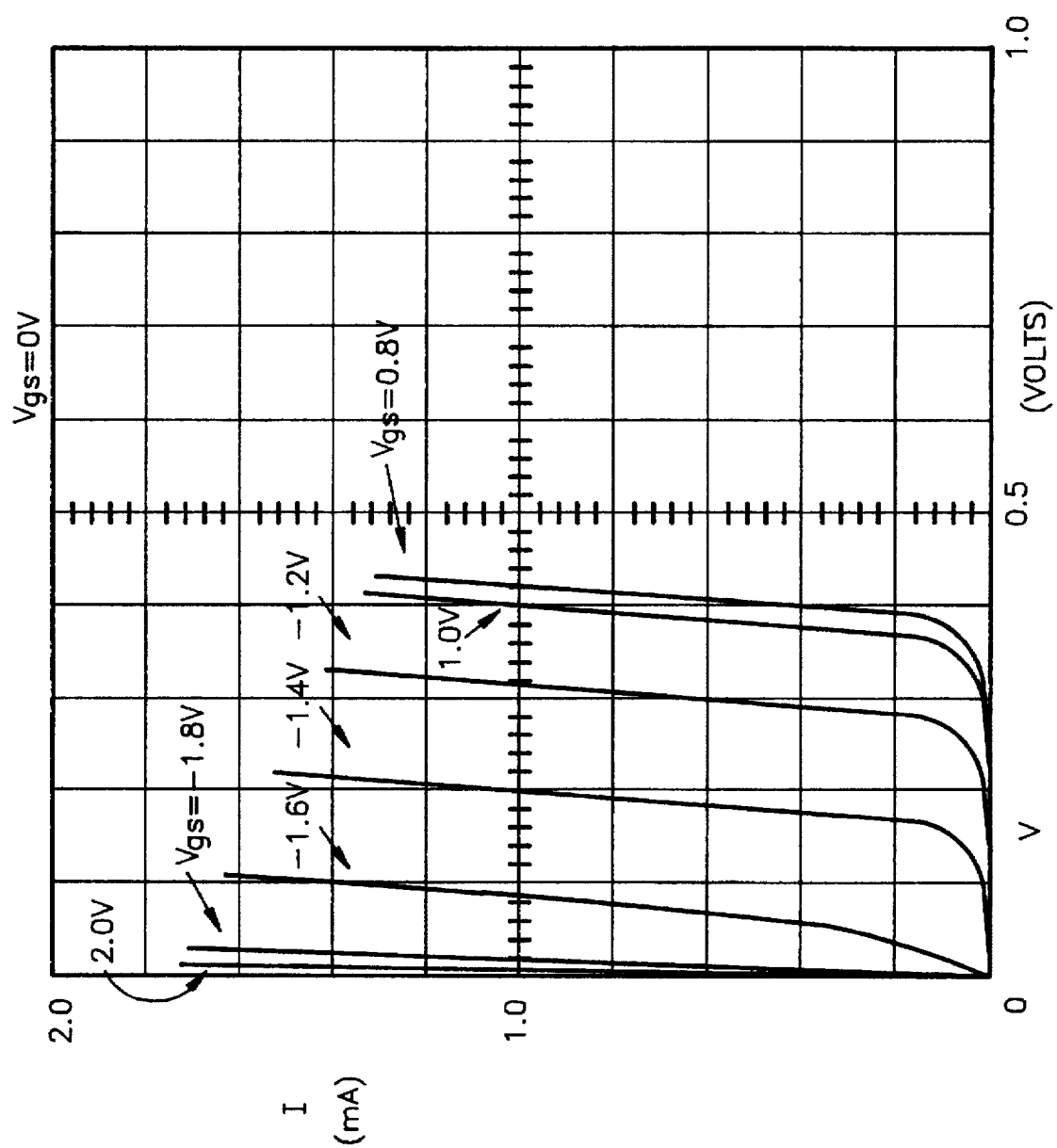
FIG. 19 illustrates a graph showing the current-voltage characteristics of the parallel combinations of MOSFETs M2/M4 and M3/M5 as a function of the gate drive on MOSFETs M2 and M3, respectively.
Figure 20:
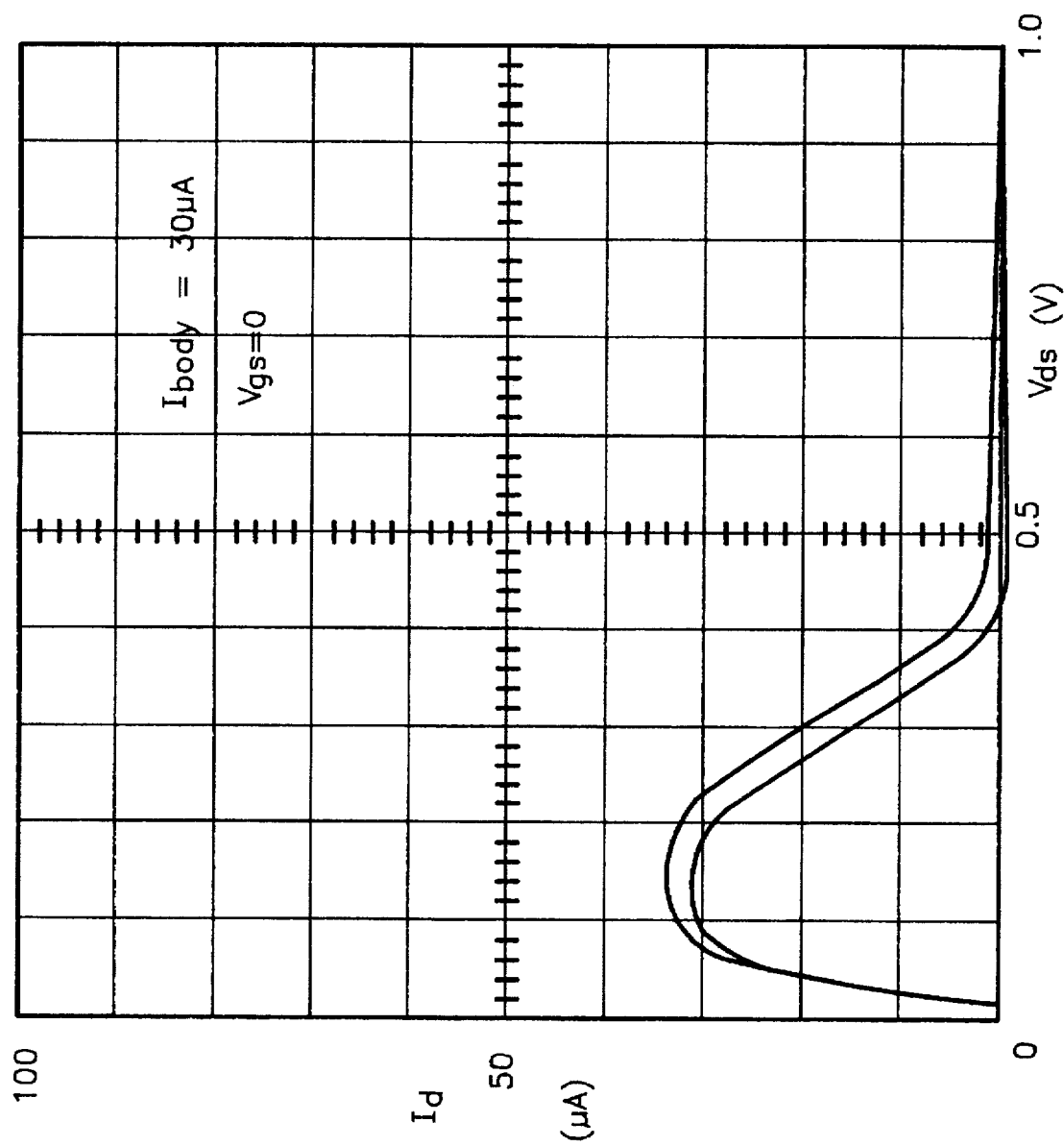
FIG. 20 illustrates a graph showing the current-voltage characteristics of the battery disconnect switch shown in FIG. 6 with the switch in an off condition and with a body current $I_{body}$ of 30 µA.

When combined with MOSFETs M2 and M3, MOSFETs M4 and M5 limit the maximum body voltage of MOSFET M1 to about 420 mV. FIG. 19 illustrates the current-voltage characteristics of the parallel combinations of MOSFETs M2/M4 and M3/M5 as a function of the gate drive voltage on MOSFETs M2 and M3. As shown, the voltage applied by the parallel combination of MOSFETs drops below the voltage applied by MOSFETs M4 and M5 alone as the gate drive voltage on MOSFETs M2 and M3 increases. As shown in FIG. 20, with MOSFET M1 turned off the combination of MOSFETs M4 and M5 with MOSFETs M2 and M3 together limits the maximum drain current $I_d$ in MOSFET M1 to about 30 μA for a 30 μA body current. Thus, the net effect is a peak MOSFET parasitic current gain of only 1. The leakage current $I_d$ shuts off beyond a $V_{ds}$ in MOSFET M1 of 150 mV.

Figure 21:
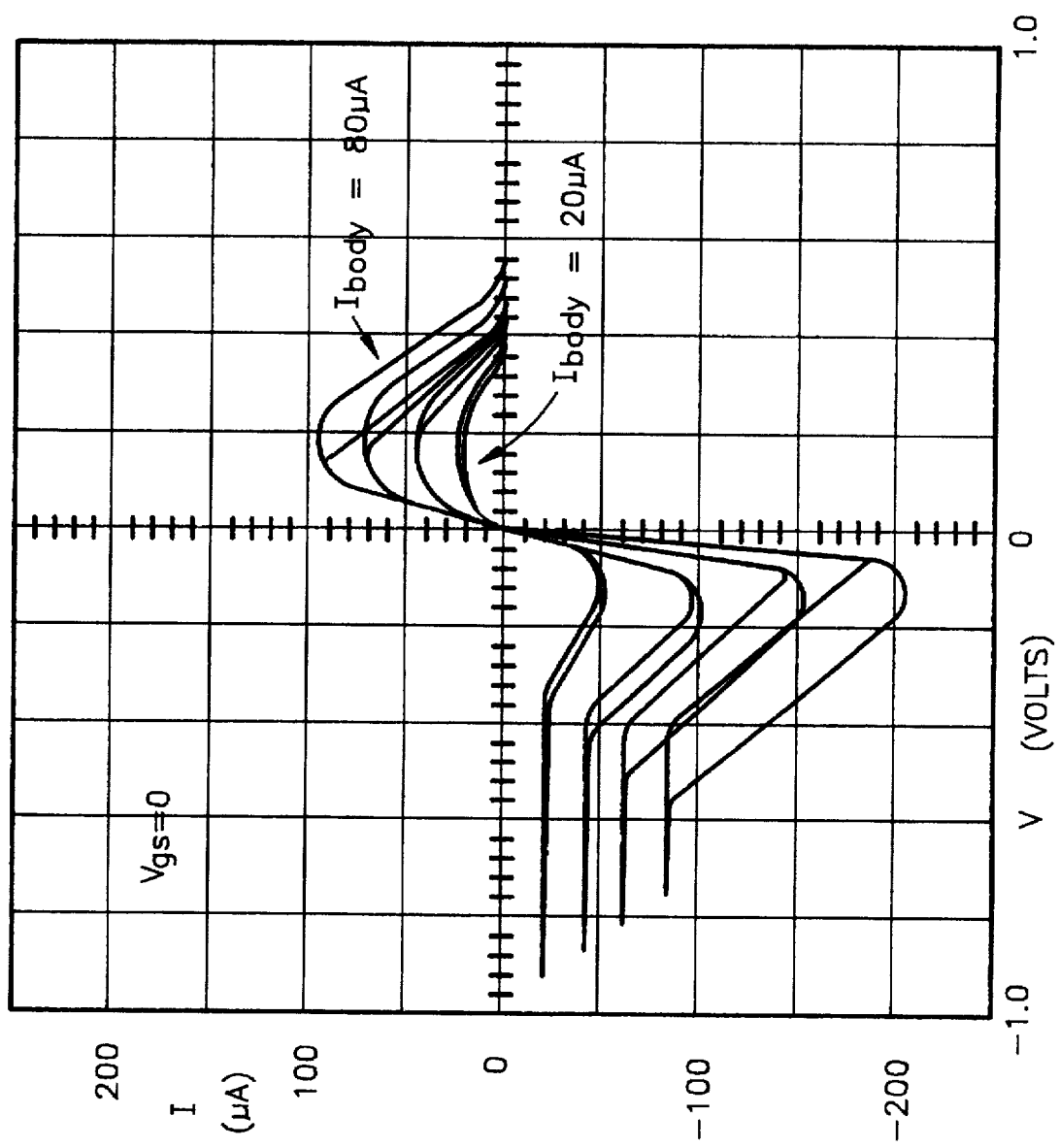
FIG. 21 illustrates a graph showing the same information as FIG. 20 with body currents of 20, 40, 60 and 80 µA.

A family of current-voltage curves for MOSFET M1 is shown in FIG. 21. The four curves are for an $I_{body}$ of 20 μA, 40 μA, 60 μA and 80 μA. (The curves are actually symmetrical about the point of origin; the offset on the vertical ($I_d$) axis in Quadrant III is an artifact of the current sense circuit of the curve tracer, which is referenced to ground. In Quadrant I (positive drain voltage and current), the base bias generator current does not flow through the sense resistor and does not appear in the curves. In Quadrant III (negative drain voltage and current), the current through the base bias generator (which is still more positive than ground) flows through the sense resistor, causing a constant offset in drain current for each of the curves.)

Figure 22:
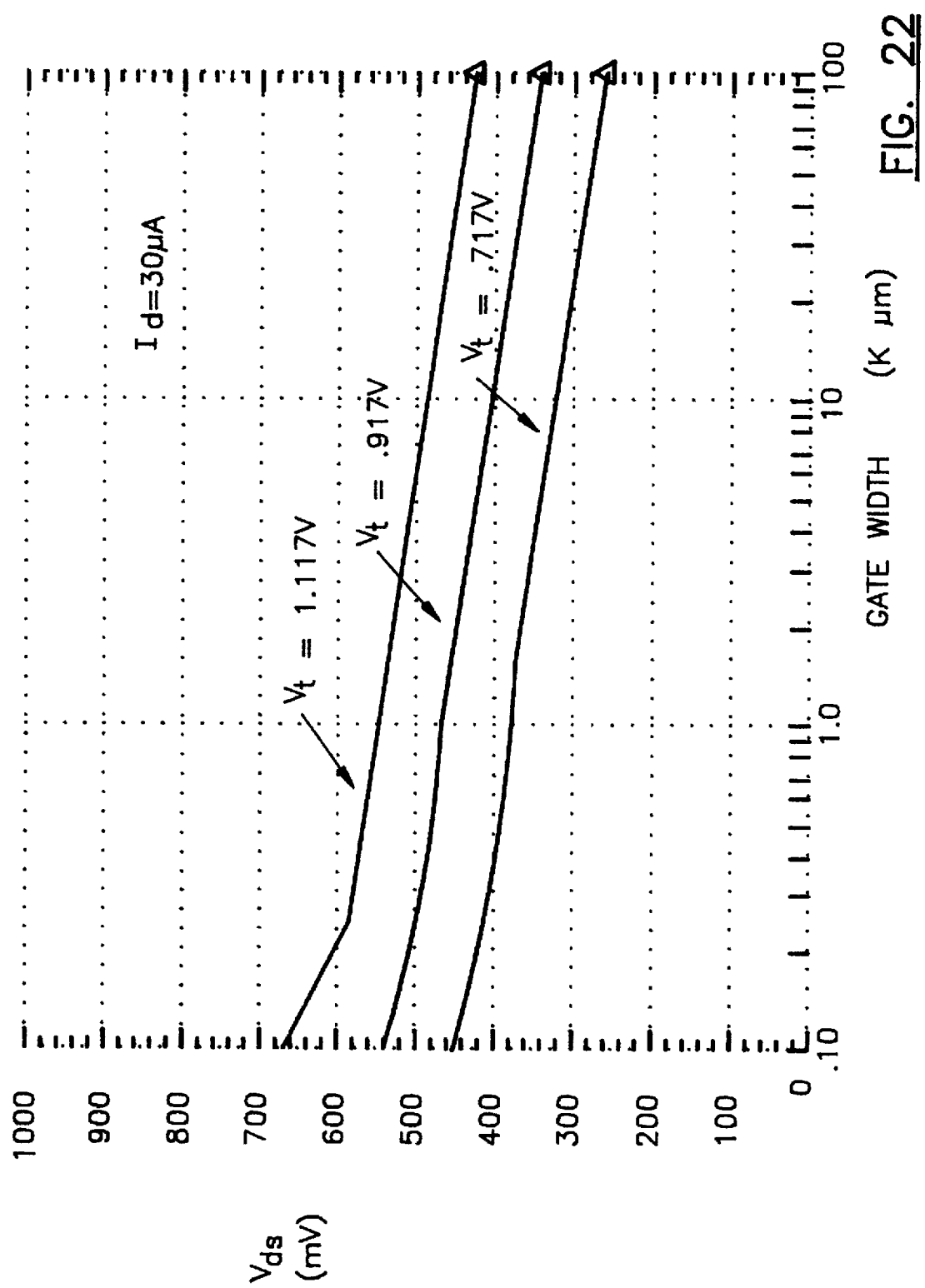
FIG. 22 illustrates a graph showing the voltage across MOSFET M4 or M5 as a function of gate width at various threshold voltages $V_t$ and with the MOSFET sinking a current of 30 µA.

Like MOSFETs M2 and M3, the size of MOSFETs M4 and M5 can be adjusted to accommodate more current. The data shown previously assume a gate width of 10,000 μm for MOSFETs M4 and M5. The simulated data in FIG. 22 show that this gate width corresponds to a voltage drop of about 400 mV. The drain current $I_d$ was 30 μA. Some oversizing of MOSFETs M4 and M5 may be desirable to accommodate for manufacturing variations in the threshold voltage.

Figure 23:
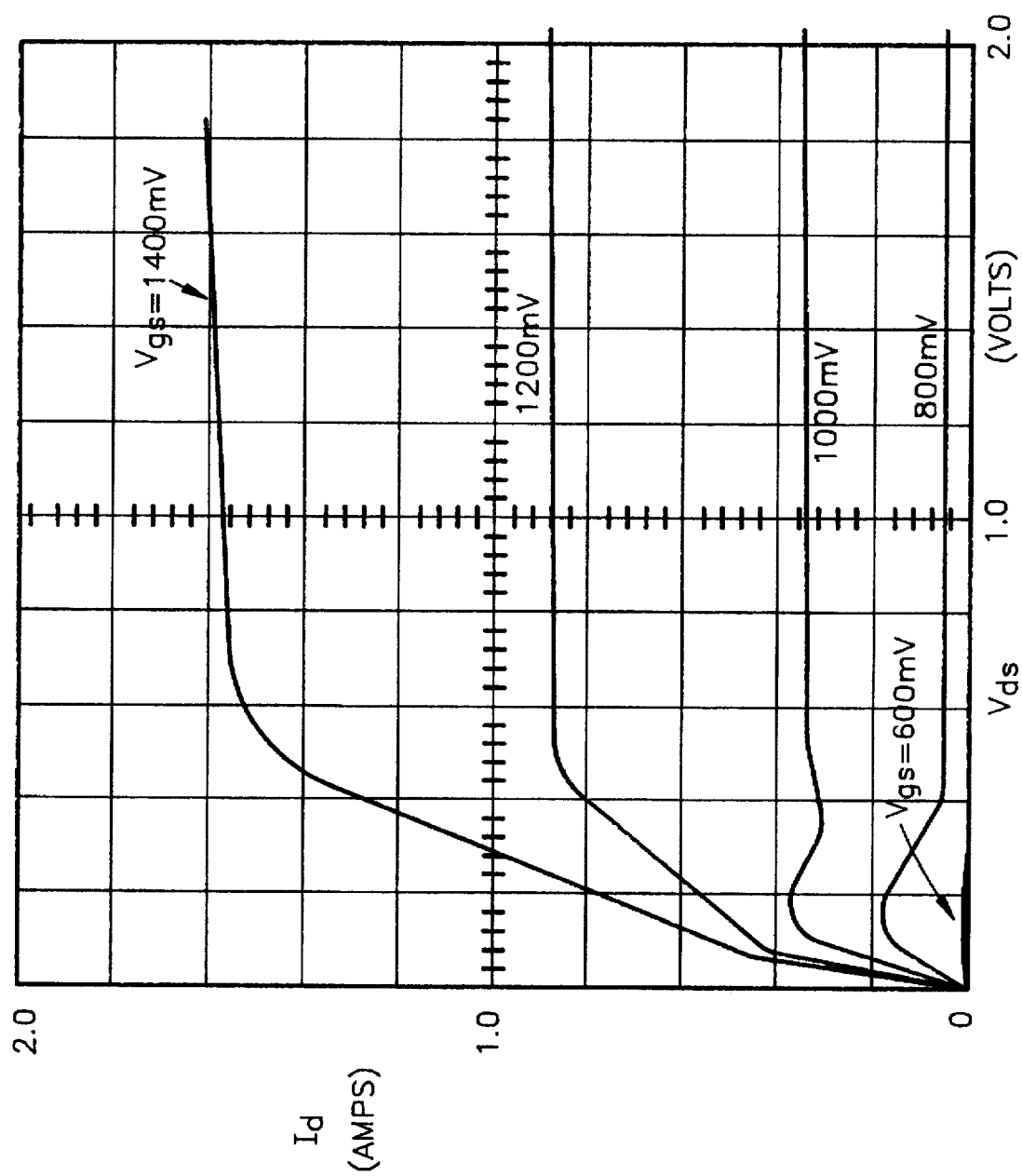
FIG. 23 illustrates the current-voltage characteristic of the bidirectional switch shown in FIG. 6 for several different levels of gate drive ($V_{gs}$).

The net current-voltage characteristics of battery disconnect switch S6, including MOSFETs M2 and M3 and MOSFETs M4 and M5, is shown in FIG. 23. Note the inflection in the lower $V_{gs}$ curves at about 150 mV.

Figure 24A:
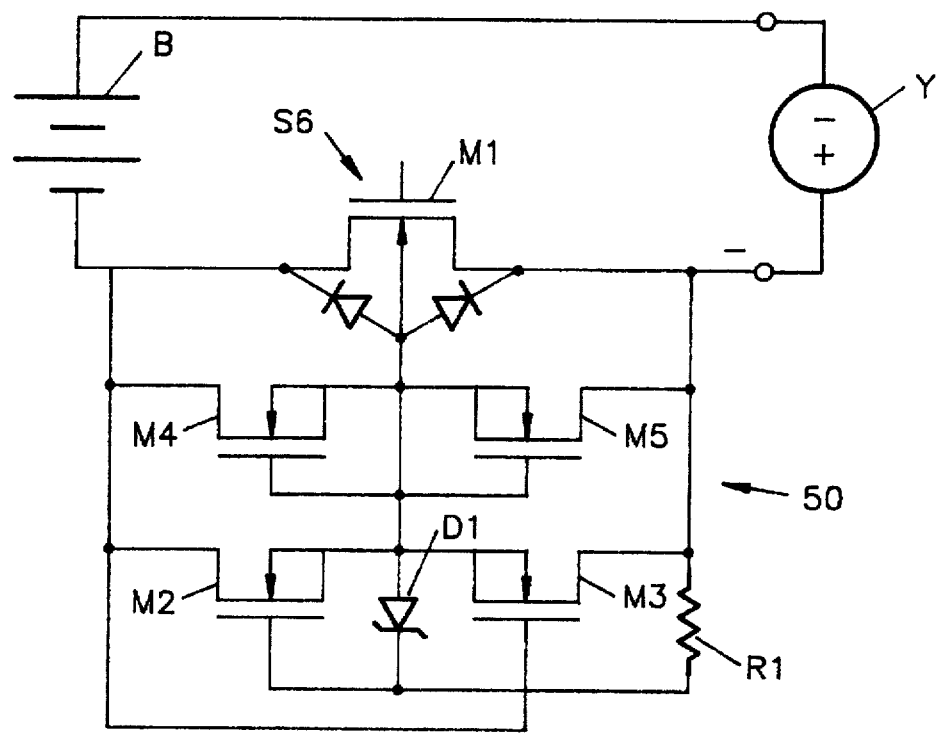
FIGS. 24A–24C illustrate circuit diagrams showing alternative methods of preventing an excessive voltage across the gate oxide of MOSFET M2 or M3 when a battery charger is connected in reverse.
Figure 24B:
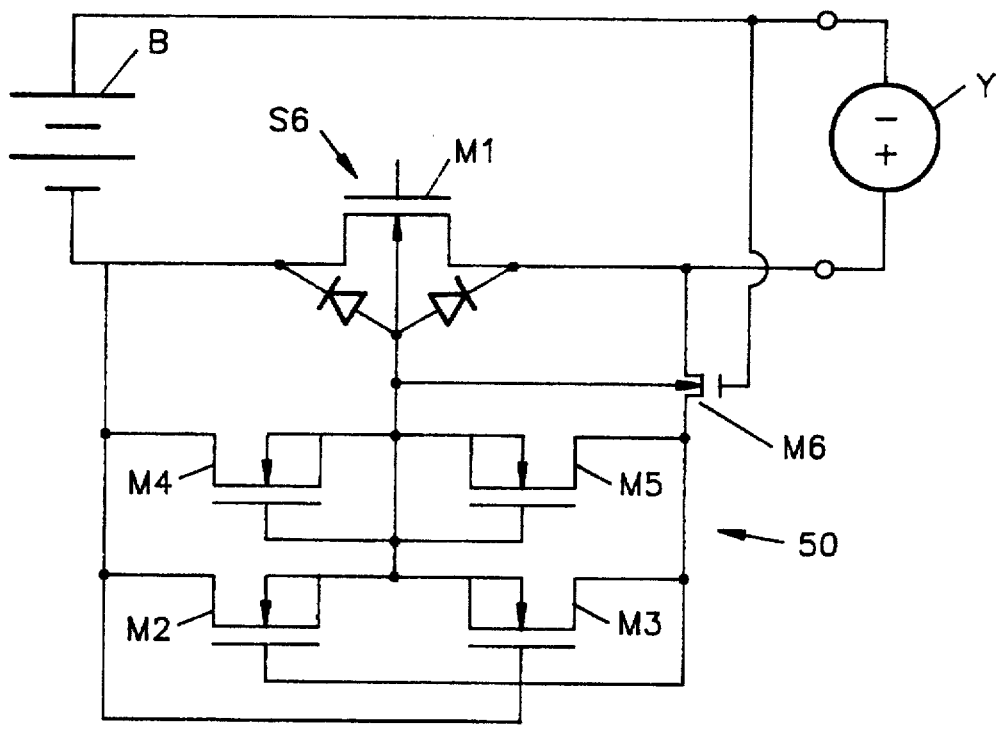

When a battery charger is connected in reverse, as shown in FIG. 4F, the total voltage across the battery disconnect switch may reach approximately 16.8 V (assuming an 8.4 V battery). This voltage typically exceeds the maximum voltage allowed on the gate of MOSFET M2. While a voltage of 16.8 V will not rupture the gate oxide of MOSFET M2, for long-term reliability of the device it is desirable to clamp this gate voltage at around 15 V (assuming a gate oxide thickness of 400 Å). FIGS. 24A and 24B illustrate two arrangements for accomplishing this.

In FIG. 24A a zener diode D1 is connected between the body of MOSFET M1 and the gate of MOSFET M2, and a current-limiting resistor R1 is connected between the source of MOSFET M1 and the gate of MOSFET M2. If it is desired to clamp the gate voltage of MOSFET M2 at 15 V, zener diode D1 should have a breakdown voltage of 15 V. Zener diode can easily be integrated into a discrete battery disconnect switch without requiring any additional external connections. The current at breakdown of diode D1 can be limited to the μA level by making resistor R1 a high value (small area) drift resistor (i.e., the N-drift implant used in the formation of the symmetrically drifted MOSFET M1 may be used as a high sheet resistance small area resistor). The only time that diode D1 will experience avalanche breakdown is during a reverse charger connection where the sum of the charger and battery voltages exceed its breakdown voltage. Otherwise, diode D1 remains off and actually provides some degree of ESD protection to the gate of MOSFET M1.

Figure 24C:
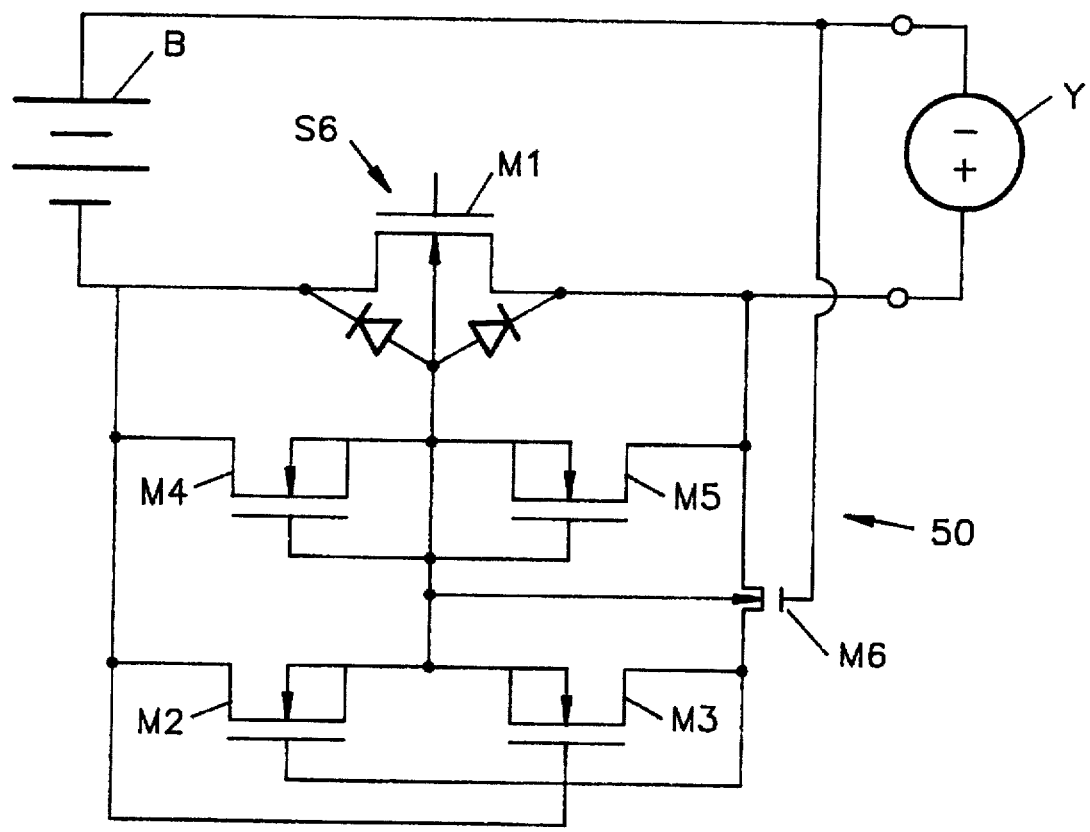

In FIG. 24B, a cascode N-channel MOSFET M6 is connected into the circuit. MOSFET M6 is a four-terminal device with no source/body short. The source/drain terminals of MOSFET M6 are connected to the source of MOSFET M1 and gate of MOSFET M2, respectively; the body of MOSFET M6 is connected to the body of MOSFET M1; and the gate of MOSFET M6 is connected to the positive terminal of battery B, a fact which makes it advantageous to implement body bias generator 50 inside the control IC. FIG. 24C shows a similar circuit in which MOSFET M6 is connected at a different position in the current path from the positive terminal of battery charger Y to the gate of MOSFET M2. This arrangement has the advantage that the resistance of MOSFET M6 does not appear in the current path through MOSFETs M4 and M5 in parallel with the conduction path through MOSFET M1.

Figure 25A:
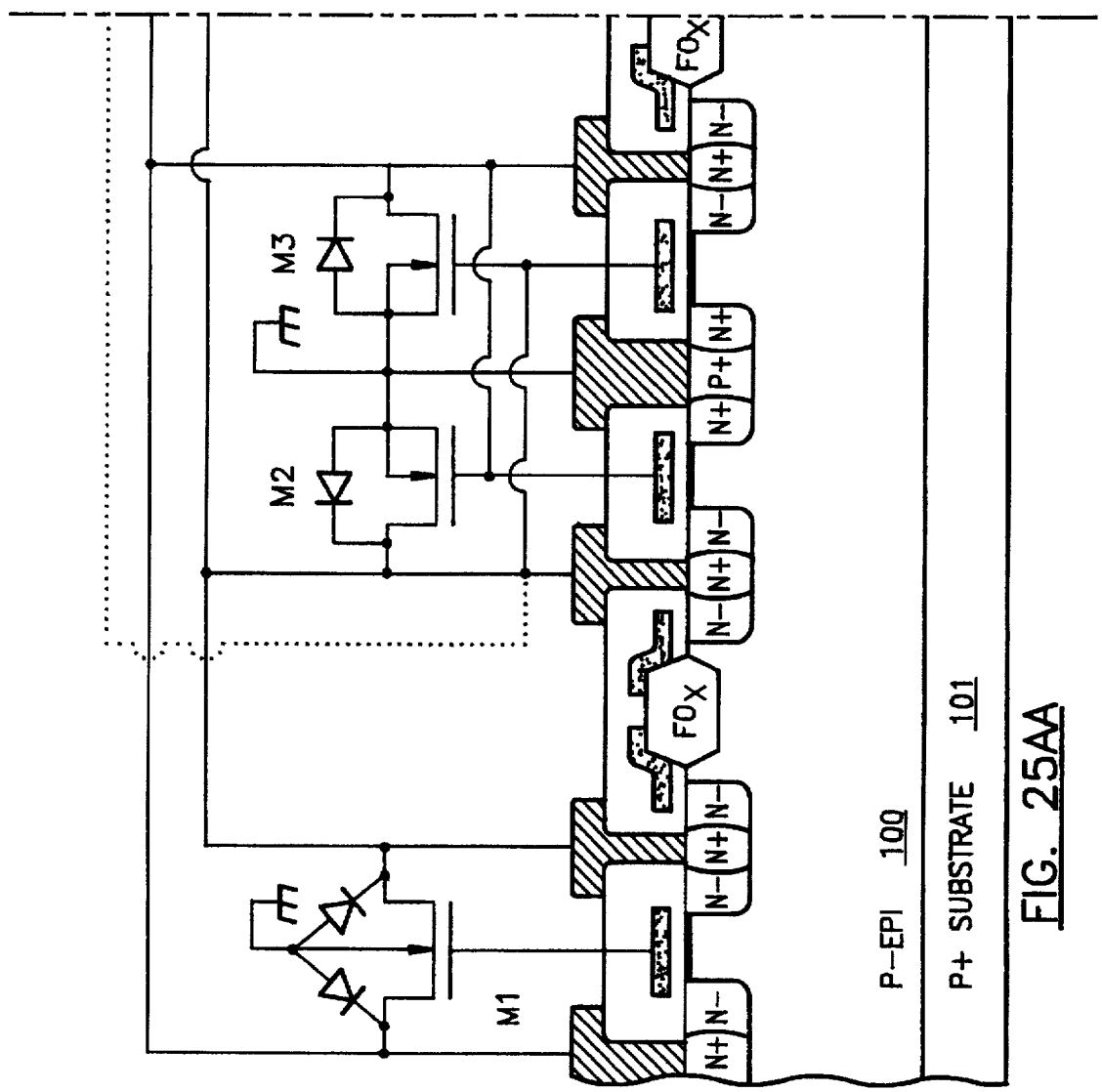
FIGS. 25A and 25B illustrate cross-sectional views of the circuits shown in FIGS. 24A and 24C, respectively, in the form of an integrated circuit.
Figure 25A:
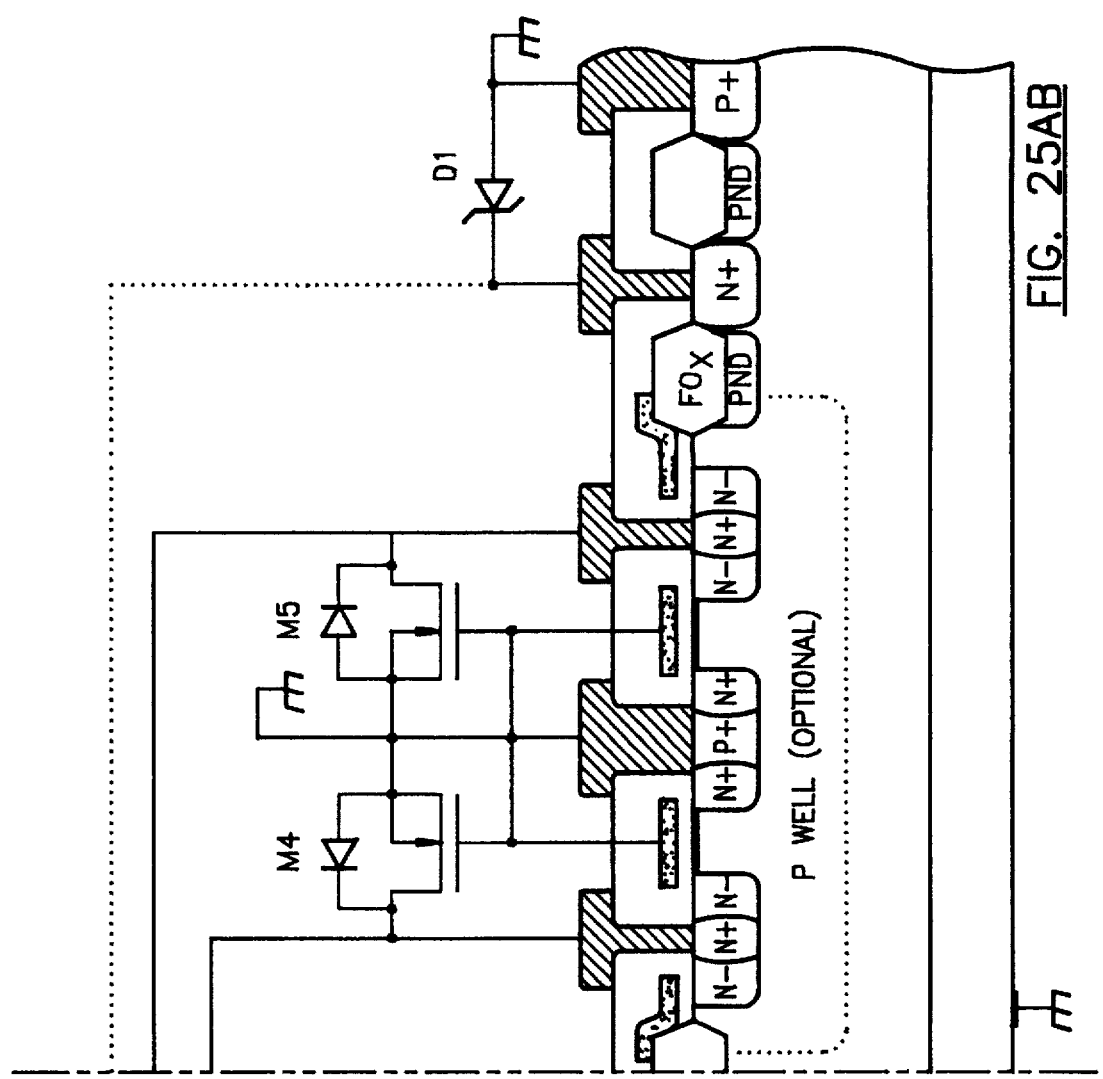

FIG. 25A shows a cross-sectional view of an integrated circuit embodiment of the circuit shown in FIG. 24A. Each of MOSFETs M1-M5 and zener diode D1 is shown schematically above the corresponding device in a P-epitaxial layer 100, which is formed on a P+ substrate 101. As indicated, MOSFET M1 is a four-terminal device having no source/body short, while MOSFETs M2-M5 each contain a source/body short. Field oxide regions separate MOSFET M1, MOSFETs M2 and M3, MOSFETs M4 and M5 and diode D1, respectively. As shown by the dashed line, the connection of diode D1 into the circuit is optional. MOSFETs M4 and M5 have threshold adjustment implants in accordance with the teachings of the above-referenced application Ser. No. 08/160,539.

Figure 26:
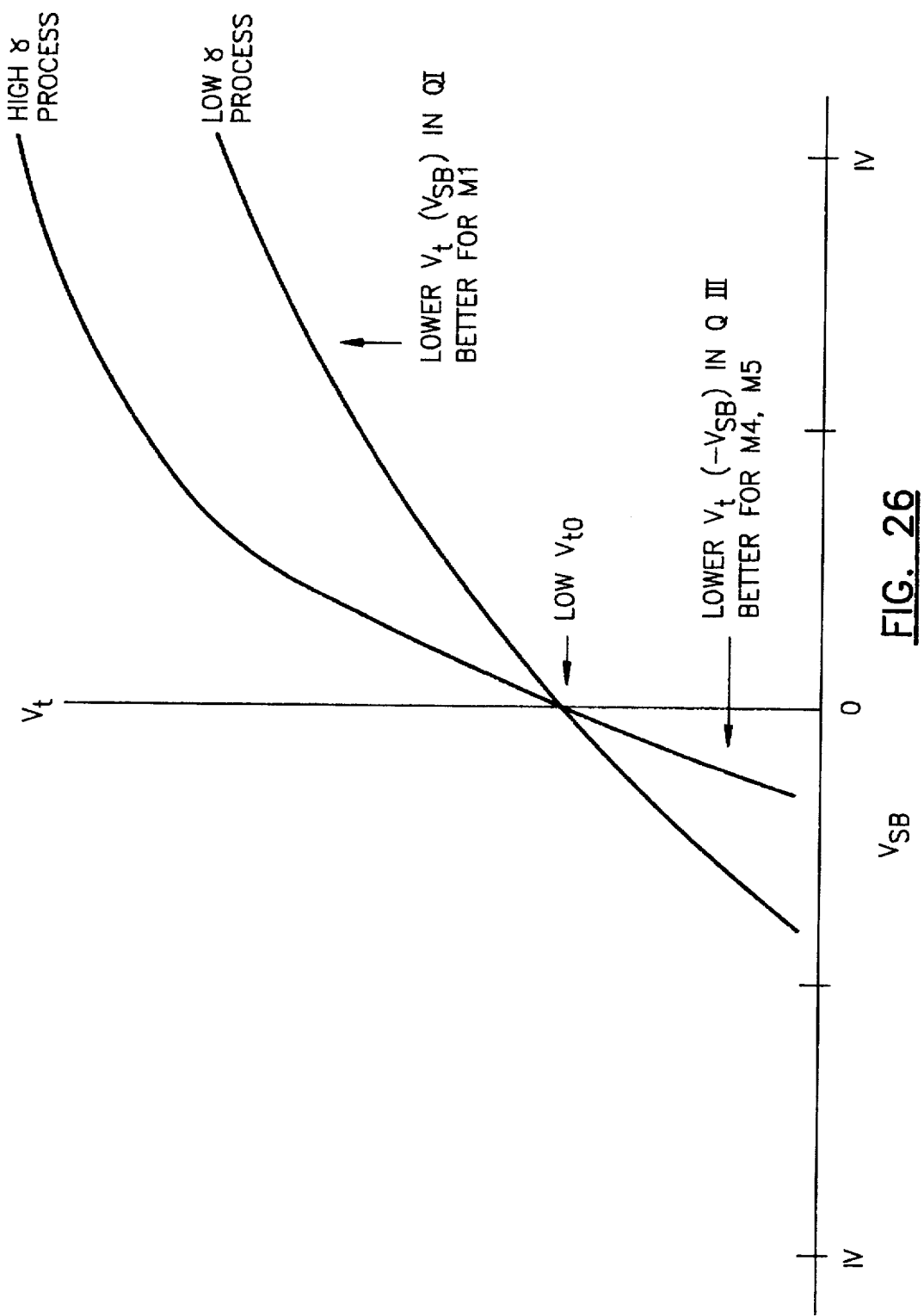
FIG. 26 illustrates a graph showing the threshold $V_t$ of a MOSFET as a function of the source-to-body voltage $V_{sb}$ at different levels of body factor ($\gamma$).

MOSFETs M4 and M5 may optionally be formed in a P-well having a dopant concentration higher than that of P-epitaxial layer 100. The higher concentration of P-type ions raises the body factor γ of MOSFETs M4 and M5, without substantially increasing their threshold voltage, and therefore causes MOSFETs M4 and M5 to turn on more quickly as the voltage at the body of MOSFET M1 increases (in a negative direction). This is desirable in order to prevent the intrinsic diodes in MOSFET M1 from becoming forward-biased. This is apparent from FIG. 26, which illustrates a graph showing the threshold voltage $V_t$ of a MOSFET as a function of the source-to-body voltage $V_{sb}$ at two levels of the body factor γ. In Quadrant I, where MOSFET M1 operates, a lower γ provides a lower $V_t$ at a given $V_{sb}$. In Quadrant III, where MOSFETs M4 and M5 operate, a higher γ provides a lower $V_t$ at a given $V_{sb}$.

Figure 25B:
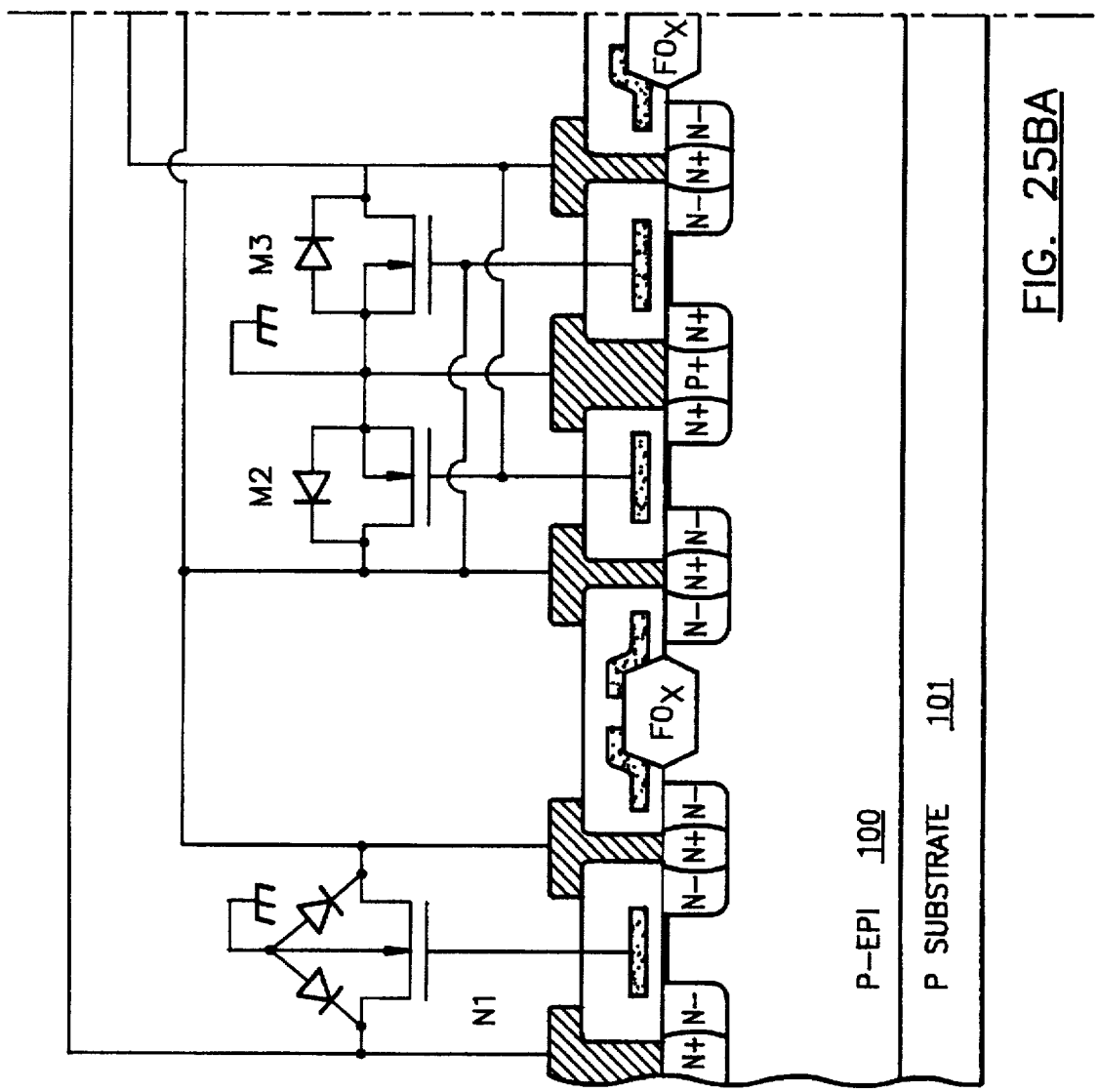
Figure 25B:
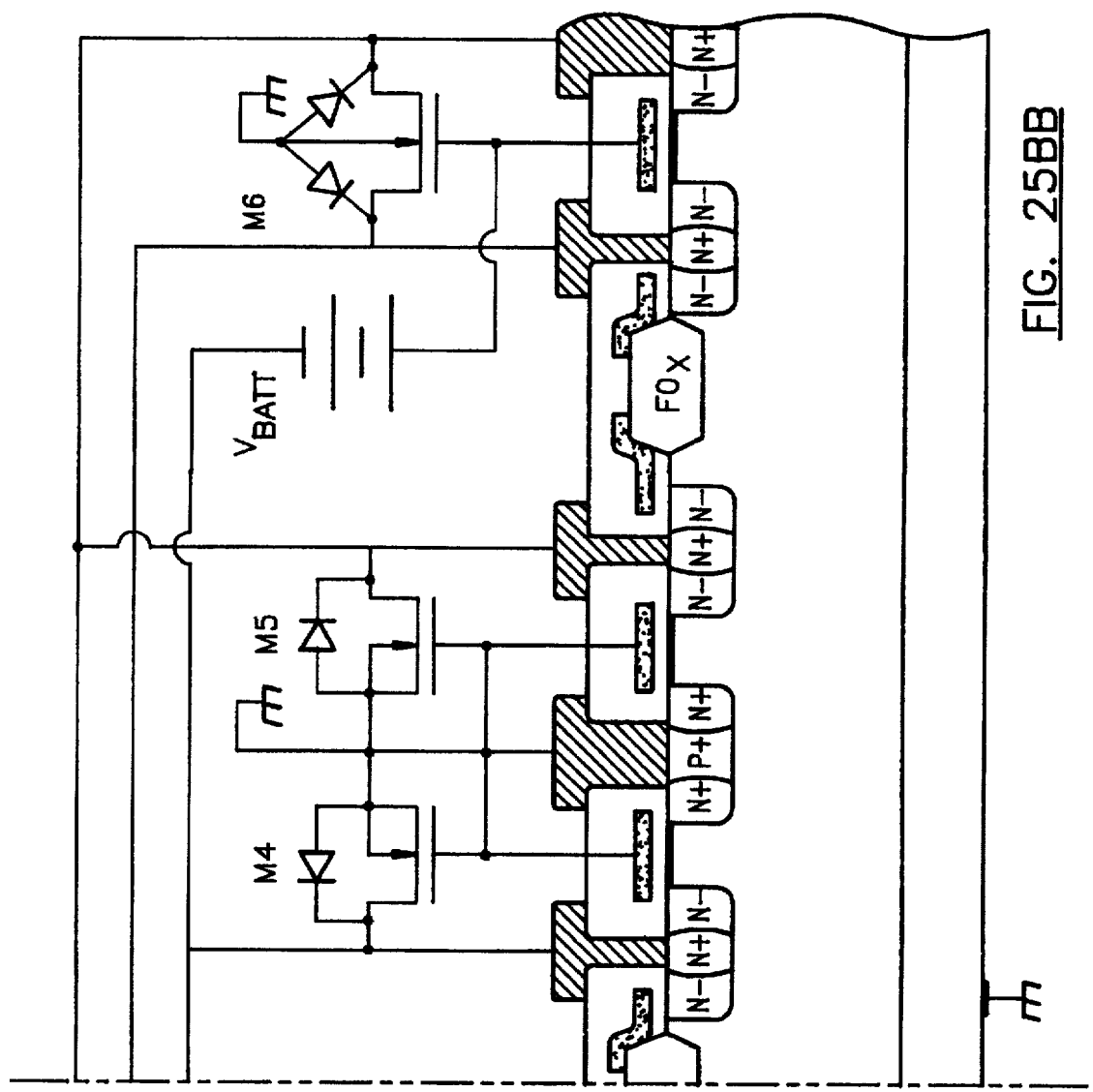

FIG. 25B is a similar drawing showing the circuit of FIG. 24C in integrated circuit form.

MOSFET M1 and MOSFETs M2-M5 (body bias generator 50) may be formed as a discrete device separate from the gate control circuitry (e.g., comparator S, OR gate T and inverter U shown in FIG. 7C), which may be formed on an IC; or body bias generator may be formed on the IC with the gate control circuitry and MOSFET M1 may be a discrete element.

Figure 27:
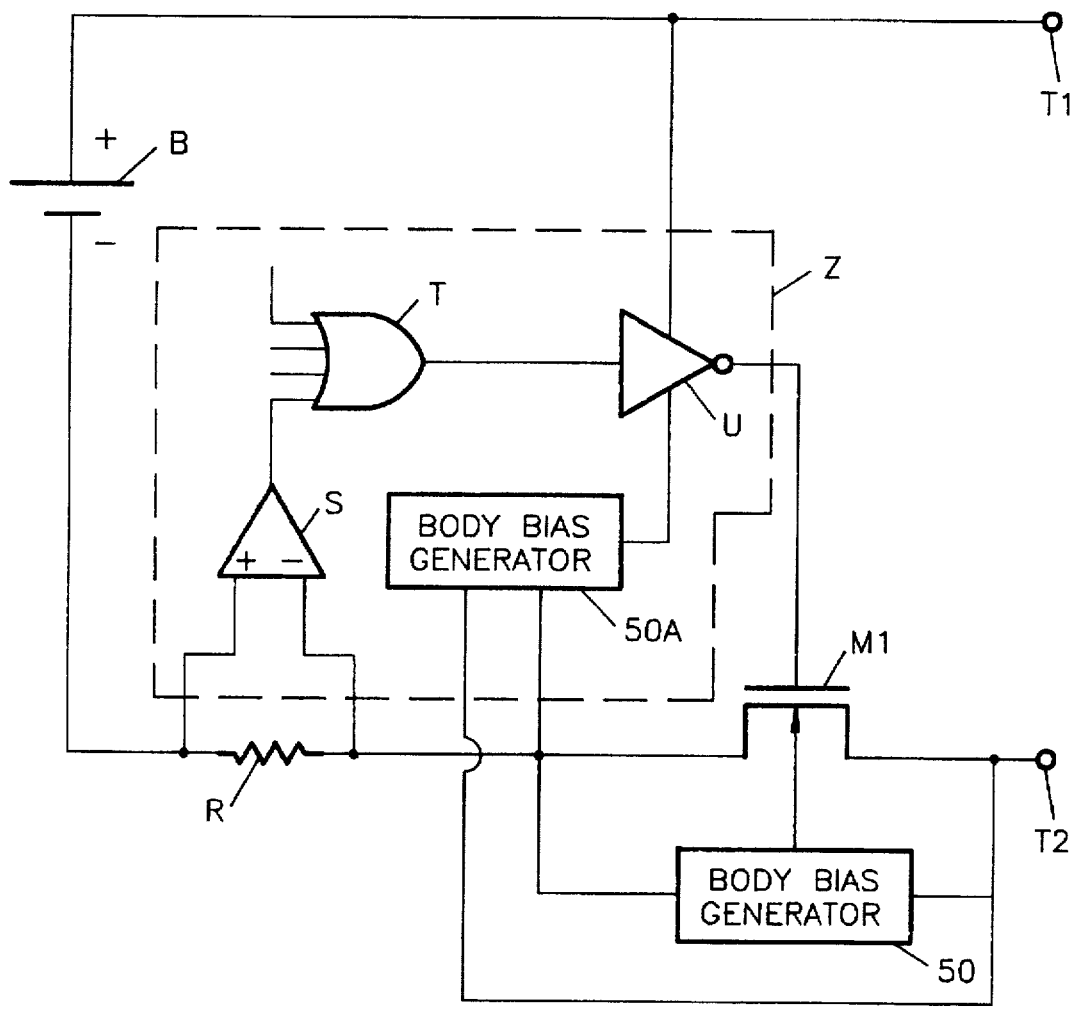
FIG. 27 illustrates a block diagram of an alternative embodiment which contains two body bias generators.

In the alternative embodiment shown in FIG. 27, a second body bias generator 50A, matched to body bias generator 50, is included in an integrated circuit Z along with the gate control circuitry. The output of body bias generator 50A is used to drive the gate of MOSFET M1 via inverter U. Since body bias generator 50 and 50A are matched, a "virtual" connection is established between the gate and body of MOSFET M1 when MOSFET M1 is turned off. Body bias generator 50A also prevents diodes within integrated circuit Z from becoming forward biased. Body bias generator 50 could also be included in integrated circuit Z.

While specific embodiments of this invention have been described, it is understood that these embodiments are illustrative and not limiting. The broad scope of this invention is limited only by the following claims.

We claim:

1. A battery disconnect switch comprising:

a first MOSFET comprising a first terminal, a second terminal, a body and a gate;

a second MOSFET connected between said first terminal and said body and having a gate connected to said second terminal;

a third MOSFET connected between said body and said second terminal and having a gate connected to said first terminal; and a fourth MOSFET connected between said first terminal and said body, a gate of said fourth MOSFET being connected to said body.

2. The battery disconnect switch of claim 1 further comprising a fifth MOSFET connected between said body and said second terminal, a gate of said fifth MOSFET being connected to said body.

3. The battery disconnect switch of claim 2 wherein each of said fourth and fifth MOSFETs includes a source/body short.

4. The battery disconnect switch of claim 1 or 2 further comprising a first conduction path extending between said gate of said first MOSFET and said body of said first MOSFET, a first switching element being connected in said first conduction path, said gate for said first MOSFET being connected to said body of said first MOSFET so as to turn said battery disconnect switch off when said first switching element is closed.

5. The battery disconnect switch of claim 4 further comprising a zener diode and a resistor connected between said body of said first MOSFET and said second terminal of said first MOSFET.

6. The battery disconnect switch of claim 2 further comprising a sixth MOSFET connected between said second terminal and said gate of said second MOSFET.

7. The battery disconnect switch of claim 6 wherein a body of said sixth MOSFET is connected to said body of said first MOSFET.

8. A battery disconnect switch comprising a MOSFET, a first switch and a first voltage clamp being connected in parallel between a first terminal and a body of said MOSFET, and a second switch being connected between a second terminal and said body of said MOSFET, said first switch being closed when a voltage at said second terminal exceeds a voltage at said first terminal by more than a predetermined amount, said second switch being closed when said voltage at said first terminal exceeds a voltage at said second terminal by more than a predetermined amount, said first voltage clamp being for clamping a voltage at said body to a level within a predetermined range from a voltage at said first terminal when both of said first and second switches are open.

9. The battery disconnect switch of claim 8 further comprising a second voltage clamp connected between said second terminal and said body for clamping a voltage at said body to a level within a predetermined range from a voltage at said second terminal when both of said first and second switches are open.

10. A combination comprising:

a load;

a battery for supplying power to said load; and a battery disconnect switch, said battery, said load and said battery disconnect switch being connected in series in a power supply circuit, said battery disconnect switch being connected between a negative terminal of said battery and said load, a first portion of said circuit extending between said negative terminal of said battery and said battery disconnect switch, and a second portion of said circuit extending between said battery disconnect switch and said load, said battery disconnect switch comprising:

a first MOSFET;

a first conduction path extending between a gate of said first MOSFET and a point in said power supply circuit between a positive terminal of said battery and said load, a first switching element being connected in said first conduction path, said battery disconnect switch being turned on when said first switching element is closed;

a second MOSFET connected between said first portion of said circuit and a body of said first MOSFET, a gate of said second MOSFET being connected to said second portion of said circuit;

a third MOSFET connected between said second portion of said circuit and said body of said first MOSFET, a gate of said third MOSFET being connected to said first portion of said circuit.

11. The battery disconnect switch of claim 10 further comprising a second-conduction path extending between said gate of said first MOSFET and a body of said first MOSFET, said first switching element being connected in said second conduction path.

12. The battery disconnect switch of claim 11 further comprising a second switching element for connecting said body of said first MOSFET to said negative terminal of said battery.

13. A combination comprising:

a battery;

a battery charger for supplying power to said battery; and a battery disconnect switch, said battery, said battery charger and said battery disconnect switch being connected in series in a power supply circuit, said battery disconnect switch being connected between a negative terminal of said battery and said battery charger, a first portion of said circuit extending between said negative terminal of said battery and said battery disconnect switch, and a second portion of said circuit extending between said battery disconnect switch and said battery charger, said battery disconnect switch comprising:

a first MOSFET;

a conduction path extending between a gate of said first MOSFET and a point in said power supply circuit between a positive terminal of said battery and said battery charger, a switching element being connected into said conduction path;

a second MOSFET connected between said first portion of said circuit and a body of said first MOSFET, a gate of said second MOSFET being connected to said second portion of said circuit;

a third MOSFET connected between said second portion of said circuit and said body of said first MOSFET, a gate of said third MOSFET being connected to said first portion of said circuit, said switch further comprising a body bias generator for connecting said body of said first MOSFET to a terminal of said battery charger when said battery charger is properly connected to said battery.

14. The battery disconnect switch of claim 13 wherein the body bias generator connects said body to said negative terminal of said battery when said battery charger is reverse connected.

15. An arrangement comprising:

a battery;

a MOSFET having a drain terminal connected to a negative terminal of said battery;

a first body bias generator connected to said drain terminal and a source terminal of said MOSFET, said body bias generator biasing a body of said MOSFET to a lower of a voltage at said drain terminal and a voltage at said source terminal of said MOSFET; and an integrated circuit comprising:

a second body bias generator connected to said drain terminal and said source terminal of said MOSFET;

an inverter, a first input of said inverter being connected to a positive terminal of said battery and a second input of said inverter being connected to an output of said second body bias generator, an output of said inverter being connected to a gate of said MOSFET.

16. The arrangement of claim 15 further comprising a current level detector connected in series with said MOSFET, an output of said current level detector being connected to an input of said inverter.

17. The arrangement of claim 15 wherein said second body bias generator forms a virtual connection between said body and said gate of said MOSFET when said MOSFET is turned off.

* * * * *